(12) United States Patent
Wikström et al.

(10) Patent No.: US 8,086,327 B2
(45) Date of Patent: Dec. 27, 2011

(54) METHODS AND APPARATUS FOR AUTOMATED PREDICTIVE DESIGN SPACE ESTIMATION

(75) Inventors: Ernst Conny Wikström, Umeå (SE); Hans Georg Joakim Sundström, Obbola (SE); Tord Åke Börje Nordahl, Umeå (SE)

(73) Assignee: MKS Instruments, Inc., Andover, MA (US)

(*) Notice: Subject to any disclaimer, the term of this patent is extended or adjusted under 35 U.S.C. 154(b) by 448 days.

(21) Appl. No.: 12/466,098

(22) Filed: May 14, 2009

(65) Prior Publication Data

US 2010/0292812 A1 Nov. 18, 2010

(51) Int. Cl.
*G05B 13/02* (2006.01)
*G06F 19/00* (2006.01)
*G06G 7/48* (2006.01)

(52) U.S. Cl. .......... 700/34; 700/31; 700/97; 703/6; 702/181

(58) Field of Classification Search .......... 700/28, 700/29, 31, 33–35, 39, 44; 703/2, 6; 702/84, 702/181, 182
See application file for complete search history.

(56) References Cited

U.S. PATENT DOCUMENTS

| | | | | |
|---|---|---|---|---|
| 5,408,405 A * | 4/1995 | Mozumder et al. | ............ | 700/31 |
| 5,710,700 A | 1/1998 | Kurtzberg et al. | ............ | 364/149 |
| 6,453,246 B1 | 9/2002 | Agrafiotis et al. | ............ | 702/27 |
| 7,191,106 B2 | 3/2007 | Minor et al. | ............ | 703/2 |
| 7,606,685 B2 | 10/2009 | Verseput et al. | ............ | 703/2 |
| 2003/0028358 A1* | 2/2003 | Niu et al. | ............ | 703/2 |

FOREIGN PATENT DOCUMENTS

WO 2004/019147 3/2004

* cited by examiner

*Primary Examiner* — Sean Shechtman
(74) *Attorney, Agent, or Firm* — Proskauer Rose LLP

(57) ABSTRACT

Described are computer-based methods and apparatuses, including computer program products, for automated predictive design space estimation. A design space of input factors and output responses is estimated for a physical process. Data is received for one or more input factors for a physical process, one or more output responses for the process, and criteria. For each of the one or more input factors, a calculated range of input values within the corresponding experimented range of input values is calculated. A modified range of input values is calculated for each of the one or more input factors. A design space estimate is predicted based at least on the modified ranges of input values, wherein the modified ranges of input values each comprise a largest region of variability for one or more of the input factors where the criteria are fulfilled.

22 Claims, 12 Drawing Sheets

FIG. 5B

Optimizer — 550

| | Factor | R | Value | Low Limit | High Limit | Sensitivity Range |
|---|---|---|---|---|---|---|
| 1 | Air | ▼ | | 240 | 284 | 5 % |
| 2 | EGR% | ▼ | | 6 | 12 | 5 % |
| 3 | Needlelift | ▼ | | -5.78 | 0 | 5 % |

558 ← 552

| | Response | Criteria | Weight | Min | Target | Max |
|---|---|---|---|---|---|---|
| 1 | Fuel | Target ▼ | 1 | 230 | 240 | 260 |
| 2 | NOx | Minimize ▼ | 1 | | 15 | 25 |
| 3 | Soot | Minimize ▼ | 1 | | 0.5 | 1 |

554

Iteration: 74   Iteration slider ——— 560   ☐ Absolute Limits  562   ☑ Analyze Sensitivity  564

| | 1 | 2 | 3 | 4 | 5 | 6 | 7 | 8 | 9 |
|---|---|---|---|---|---|---|---|---|---|
| | Air | EGR% | Needlelift | Fuel | NOx | Soot | Iter | log(D) | DPMO |
| 1 | 243.667 | 10.5 | -5.5873 | 244.475 | 14.1468 | 0.6611 | 7 | -1.1498 | 4000 |
| 2 | 275.572 | 9.8691 | -3.2801 | 248.707 | 17.3854 | 0.5241 | 22 | -1.0774 | 0 |
| 3 | 240.091 | 10.9392 | -5.7757 | 242.534 | 13.0666 | 0.7865 | 74 | -0.8306 | 67400 |
| 4 | 283.849 | 8.2752 | -4.3068 | 251.492 | 20.7931 | 0.2057 | 47 | -0.6538 | 0 |
| 5 | 262 | 9.6 | -2.89 | 243.575 | 17.9501 | 0.6505 | 0 | -1.0571 | 0 |
| 6 | 284 | 9.2 | -3.16 | 247.43 | 19.0189 | 0.3688 | 0 | -1.0007 | 0 |
| 7 | 261 | 9.2 | -3.16 | 243.949 | 18.7348 | 0.5393 | 0 | -1.1975 | 0 |
| 8 | 261 | 9 | -3.16 | 243.771 | 19.2418 | 0.5021 | 0 | -1.1437 | 0 |

556

METHODS AND APPARATUS FOR AUTOMATED PREDICTIVE DESIGN SPACE ESTIMATION

FIELD OF THE INVENTION

The present invention relates generally to computer-based methods and apparatuses, including computer program products, for automated predictive design space estimation.

BACKGROUND

In the pharmaceutical industry, the adoption of quality by design (QbD) has been an evolving process. QbD refers to a systematic process to build quality into a product from the inception to the final output. Specifically, QbD refers to the level of effectiveness of a design function in determining a product's operational requirements (and their incorporation into design requirements) that can be converted into a finished product in a production process. This is often referred to as a design space, which is the multidimensional combination and interaction of input factors (e.g., material attributes) that have been demonstrated to provide assurance of quality. For example, for a manufacturing process a design space is the set of possible designs and design parameters (input factors) that meet a specific product requirement (one or more output responses). Exploring a design space requires evaluating the various design options possible with a given technology and optimizing the input factors and output responses with respect to specific constraints (e.g., power, cost, mixture design).

In the semiconductor device manufacturing industry, device manufacturers have transitioned to more closely toleranced process and materials specifications by relying on process tool manufacturers to design better and/or faster process and hardware configurations. However, as device geometries shrink to the nanometer scale, complexity in manufacturing processes increases, and process and material specifications become more difficult to meet.

A typical process tool used in current semiconductor manufacturing can be described by a set of several thousand process variables. The variables are generally related to physical parameters of the manufacturing process and/or tools used in the manufacturing process. In some cases, of these several thousand variables, several hundred variables are dynamic (e.g., changing in time during the manufacturing process or between manufacturing processes). The dynamic variables (e.g., gas flow, gas pressure, delivered power, current, voltage, and temperature) change based on various operating factors (e.g., a specific processing recipe, the particular step or series of steps in the overall sequence of processing steps, errors and faults that occur during the manufacturing process or changes (e.g., referred to as "drift") in parameter values based on use of a particular tool or chamber).

Operators can control the manufacturing process by, for example, changing input factors, which are variables that influence the production process. For each manufacturing process, output response values (e.g., temperature, yield, quality attributes) can be measured that depend on input factors. Experiments can be performed for the particular manufacturing process to determine what combinations of input factor values result in acceptable output response values.

A Design of Experiment (DOE) method is a structured, organized method for determining the relationship between input factors for a process (e.g., a manufacturing process, mixture design) and the output responses of that process. The DOE method can quantify indeterminate measurements of input factors and interactions between the input factors statistically through observing the results of methodical changes of the input factors. If there are operational criteria associated with the process, output response values are measured for different combinations of input factors to determine if the operational criteria are satisfied for each combination.

Exploring a design space requires manually evaluating the various design options possible based on any operational criteria. There is no way to automatically provide for acceptable regions of variability of each input factor, or to predict result regions. The analysis process is further complicated when several demands on the output responses have to be met at the same time with different types of constraints. Further, it would be desirable for graphical methods to display design spaces in a way that can be easily analyzed and interpreted by an operator.

SUMMARY OF THE INVENTION

The invention, in one aspect, features a computerized method for estimating a design space of input factors and output responses for a physical process. For every embodiment described herein, a physical process can be an industrial process, a manufacturing process, a semiconductor process, an analytical system or procedure, or a design project. The method includes receiving, via a processor, data for one or more input factors for a physical process, one or more output responses for the process, and criteria. The criteria includes a target response criterion for each of the one or more output responses, an estimated optimal value for each of the one or more input factors to achieve the target response criteria, and an experimented range of input values for each of the one or more input factors, where each input value in the experimented range of input values is determinative of an output response value for each of the one or more output responses. The method includes calculating, using the processor, for each of the one or more input factors, a calculated range of input values within the corresponding experimented range of input values. Calculating comprises selecting a first range of input values for each of the one or more input factors, predicting values of the one or more output responses based on the first range of input values to determine a first performance metric for each of the one or more output responses, and creating the calculated range of input values for each of the one or more input factors by adjusting the first range of input values based on a comparison of the first performance metric and a predetermined performance metric. The method includes calculating, using the processor, a modified range of input values for each of the one or more input factors. For each input factor of the one or more input factors, the method includes selecting a second range of input values by expanding the calculated range of input values by a predetermined percentage, predicting values of the one or more output responses based on the second range of input values to determine a second performance metric for each of the one or more output responses, and creating the modified range of input values for the input factor by adjusting the second range of input values based on a comparison of the second performance metric and the predetermined performance metric. The method includes predicting, using the processor, a design space estimate based at least on the modified ranges of input values, wherein the modified ranges of input values each comprise a largest region of variability where the criteria are fulfilled for one or more of the input factors.

In another embodiment, the design space estimate further comprises a distribution of output response values for each of the one or more output responses, wherein the modified ranges of input values are determinative of the distribution of output response values. For each of the one or more output responses, a prespecified number of output response values within the distribution of output response values can be within predetermined limit values for the output response if the predetermined performance metric is satisfied.

In another embodiment, predicting the design space estimate includes predicting an individual largest region of variability for each input factor while any remaining input factors are set to their associated estimated optimal value. Predicting the design space estimate can include predicting a combined largest region of variability for each input factor, wherein values of each of the one or more input factors can be anywhere within the corresponding combined largest region of variability and satisfy the predetermined performance metric for each output response.

In another embodiment, creating the calculated range of input values includes selecting a third range of input values by reducing the first range of input values by a predetermined percentage if the first performance metric is below the predetermined performance metric. The method can include predicting values of the one or more output responses based on the third range of input values to determine a third performance metric for each of the one or more output responses, and creating the calculated range of input values for each of the one or more input factors by adjusting the third range of input values based on a comparison of the third performance metric and the predetermined performance metric.

In another embodiment, creating the calculated range of input values includes the following steps if the first performance metric is above the predetermined performance metric: setting a step size to a predetermined percentage of a size of the second range of input values, selecting a third range of input values by expanding the first range of input values based on the step size, predicting values of the one or more output responses based on the third range of input values to determine a third performance metric for each of the one or more output responses, and creating the calculated range of input values for each of the one or more input factors by adjusting the third range of input values based on a comparison of the third performance metric and the predetermined performance metric.

In another embodiment, creating the calculated range of input values includes the following steps if the third performance metric is below the predetermined performance metric: selecting a fourth range of input values by expanding the third range of input values based on the step size, predicting values of the one or more output responses based on the fourth range of input values to determine a fourth performance metric for each of the one or more output responses, and creating the calculated range of input values for each of the one or more input factors by adjusting the fourth range of input values based on a comparison of the fourth performance metric and the predetermined performance metric. Creating the calculated range of input values can include the following steps if the third performance metric is above the predetermined performance metric: setting the third range of input values equal to the first range of input values, reducing the step size by a predetermined percentage, selecting a fourth range of input values by expanding the third range of input values based on the step size, predicting values of the one or more output responses based on the fourth range of input values to determine a fourth performance metric for each of the one or more output responses, and creating the calculated range of input values for each of the one or more input factors by adjusting the fourth range of input values based on a comparison of the fourth performance metric and the predetermined performance metric.

In another embodiment, creating the modified range of input values includes the following steps if the second performance metric is above the predetermined performance metric: setting the modified range of input values equal to the second range of input values, and associating a completion flag with the input factor. Creating the modified range of input values can include the following steps if the second performance metric is below the predetermined performance metric: selecting a third range of input values by expanding the second range of input values by a step size, wherein the step size was used to select the second range of input values, predicting values of the one or more output responses based on the third range of input values to determine a third performance metric for each of the one or more output responses, and creating the modified range of input values for the input factor by adjusting the third range of input values based on a comparison of the third performance metric and the predetermined performance metric.

In another embodiment, calculating the modified range of input values for each of the one or more input factors further includes the following steps: determining each of the one or more input factors are associated with a completion flag, reducing a step size used to select the second range of input values by a predetermined percentage, and for each of the one or more input factors of the one or more input factors: selecting a third range of input values by expanding the second range of input values by the step size, predicting values of the one or more output responses based on the third range of input values to determine a third performance metric for each of the one or more output responses, and creating the modified range of input values for the input factor by adjusting the third range of input values based on a comparison of the third performance metric and the predetermined performance metric.

In another embodiment, predicting the values of the one or more output responses includes performing a Monte Carlo simulation, and the first performance metric, the second performance metric, and the predetermined performance metric are a measure of the number of values of the one or more output responses within predetermined limit values. Selecting the first range of input values for each of the one or more input factors can include setting the first range of input values to a predetermined percentage of a lower outer bound value of the corresponding input factor.

In another embodiment, the method includes the following steps, receiving a constraint for the one or more input factors, and predicting values of the one or more output responses based on the first range of input values further comprises adjusting the prediction to compensate for the constraint. The constraint can include a user defined limit on one or more input factors, a factor distribution, or any combination thereof. The target response criterion for each of the one or more output responses can include a target response value, a range of acceptable target response values, or a critical target response value, where the output response can either be above or below the critical target response value. In one embodiment, the physical process comprises a manufacturing process, an industrial process, a design project, a semiconductor project, or any combination thereof.

The invention, in another aspect, features an apparatus for estimating a design space of input factors and output responses for a physical process. The apparatus includes a processor configured to receive data for one or more input factors for a physical process, one or more output responses for the process, and criteria. The criteria includes a target response criterion for each of the one or more output responses, an estimated optimal value for each of the one or more input factors to achieve the target response criteria, and an experimented range of input values for each of the one or more input factors, where each input value in the experimented range of input values is determinative of an output response value for each of the one or more output responses. The processor is further configured to calculate, for each of the one or more input factors, a calculated range of input values within the corresponding experimented range of input values. Calculating includes selecting a first range of input values for each of the one or more input factors, predicting values of the one or more output responses based on the first range of input values to determine a first performance metric for each of the one or more output responses, and creating the calculated range of input values for each of the one or more input factors by adjusting the first range of input values based on a comparison of the first performance metric and a predetermined performance metric. The processor is further configured to calculate a modified range of input values for each of the one or more input factors. Calculating includes, for each input factor of the one or more input factors, selecting a second range of input values by expanding the calculated range of input values by a predetermined percentage, predicting values of the one or more output responses based on the second range of input values to determine a second performance metric for each of the one or more output responses, and creating the modified range of input values for the input factor by adjusting the second range of input values based on a comparison of the second performance metric and the predetermined performance metric. The processor is further configured to predict a design space estimate based at least on the modified ranges of input values, wherein the modified ranges of input values each comprise a largest region of variability where the criteria are fulfilled for one or more of the input factors.

The invention, in another aspect, features a computer program product, tangibly embodied in an information carrier. The computer program product includes instructions being operable to cause a data processing apparatus to receive data for one or more input factors for a physical process, one or more output responses for the process, and criteria. The criteria includes a target response criterion for each of the one or more output responses, an estimated optimal value for each of the one or more input factors to achieve the target response criteria, and an experimented range of input values for each of the one or more input factors, where each input value in the experimented range of input values is determinative of an output response value for each of the one or more output responses. The computer program product further includes instructions being operable to cause a data processing apparatus to calculate, for each of the one or more input factors, a calculated range of input values within the corresponding experimented range of input values. Calculating includes selecting a first range of input values for each of the one or more input factors, predicting values of the one or more output responses based on the first range of input values to determine a first performance metric for each of the one or more output responses, and creating the calculated range of input values for each of the one or more input factors by adjusting the first range of input values based on a comparison of the first performance metric and a predetermined performance metric. The computer program product further includes instructions being operable to cause a data processing apparatus to calculate a modified range of input values for each of the one or more input factors. Calculating includes, for each input factor of the one or more input factors, selecting a second range of input values by expanding the calculated range of input values by a predetermined percentage, predicting values of the one or more output responses based on the second range of input values to determine a second performance metric for each of the one or more output responses, and creating the modified range of input values for the input factor by adjusting the second range of input values based on a comparison of the second performance metric and the predetermined performance metric. The computer program product further includes instructions being operable to cause a data processing apparatus to predict a design space estimate based at least on the modified ranges of input values, wherein the modified ranges of input values each comprise a largest region of variability where the criteria are fulfilled for one or more of the input factors.

The invention, in another aspect, features a system for estimating a design space of input factors and output responses for a physical process. The system includes means for receiving data for one or more input factors for a physical process, one or more output responses for the process, and criteria. The criteria include a target response criterion for each of the one or more output responses, an estimated optimal value for each of the one or more input factors to achieve the target response criteria, and an experimented range of input values for each of the one or more input factors, where each input value in the experimented range of input values is determinative of an output response value for each of the one or more output responses. The system further includes means for calculating, for each of the one or more input factors, a calculated range of input values within the corresponding experimented range of input values. Calculating includes selecting a first range of input values for each of the one or more input factors, predicting values of the one or more output responses based on the first range of input values to determine a first performance metric for each of the one or more output responses, and creating the calculated range of input values for each of the one or more input factors by adjusting the first range of input values based on a comparison of the first performance metric and a predetermined performance metric. The system further includes means for calculating a modified range of input values for each of the one or more input factors. Calculating includes, for each input factor of the one or more input factors, selecting a second range of input values by expanding the calculated range of input values by a predetermined percentage, predicting values of the one or more output responses based on the second range of input values to determine a second performance metric for each of the one or more output responses, and creating the modified range of input values for the input factor by adjusting the second range of input values based on a comparison of the second performance metric and the predetermined performance metric. The system further includes means for predicting a design space estimate based at least on the modified ranges of input values, wherein the modified ranges of input values each comprise a largest region of variability where the criteria are fulfilled for one or more of the input factors.

The techniques, which include both methods and apparatuses, described herein can provide the advantages of automating a process for defining a largest region of variability for each input factor, and predicting a distribution of output response values for each output response with a given level of probability. The largest regions of variability and the distributions of output response values can be presented in a way to incorporate all the different criteria under consideration in an efficient and correct way. The principles described herein can handle many output responses simultaneously with different prediction models for design space estimates, which can be handled in combination with expansion criteria. Additionally, constraints for the input factors and/or the output responses can be incorporated into the prediction models.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings.

FIG. 5B is a diagram illustrating a graphical display for configuring parameters used to calculate an automated predictive design space estimate, according to an illustrative embodiment of the invention.

DETAILED DESCRIPTION

In some exemplary embodiments of the invention, a predictive design space estimate (PDSE) is determined for a physical process (e.g., a manufacturing process, industrial process, or a design project) based on input factors, output responses, and various criteria associated with the input factors and/or the output responses. The PDSE includes a distribution of output response values for each of the one or more output responses. The PDSE also includes one or more largest regions of variability for each input factor. In some embodiments, the PDSE includes an individual largest region of variability and a combined largest region of variability for each input factor, both of which are calculated based on the distribution of output response values to satisfy the criteria associated with the input factors and/or the output responses.

Figure 1:
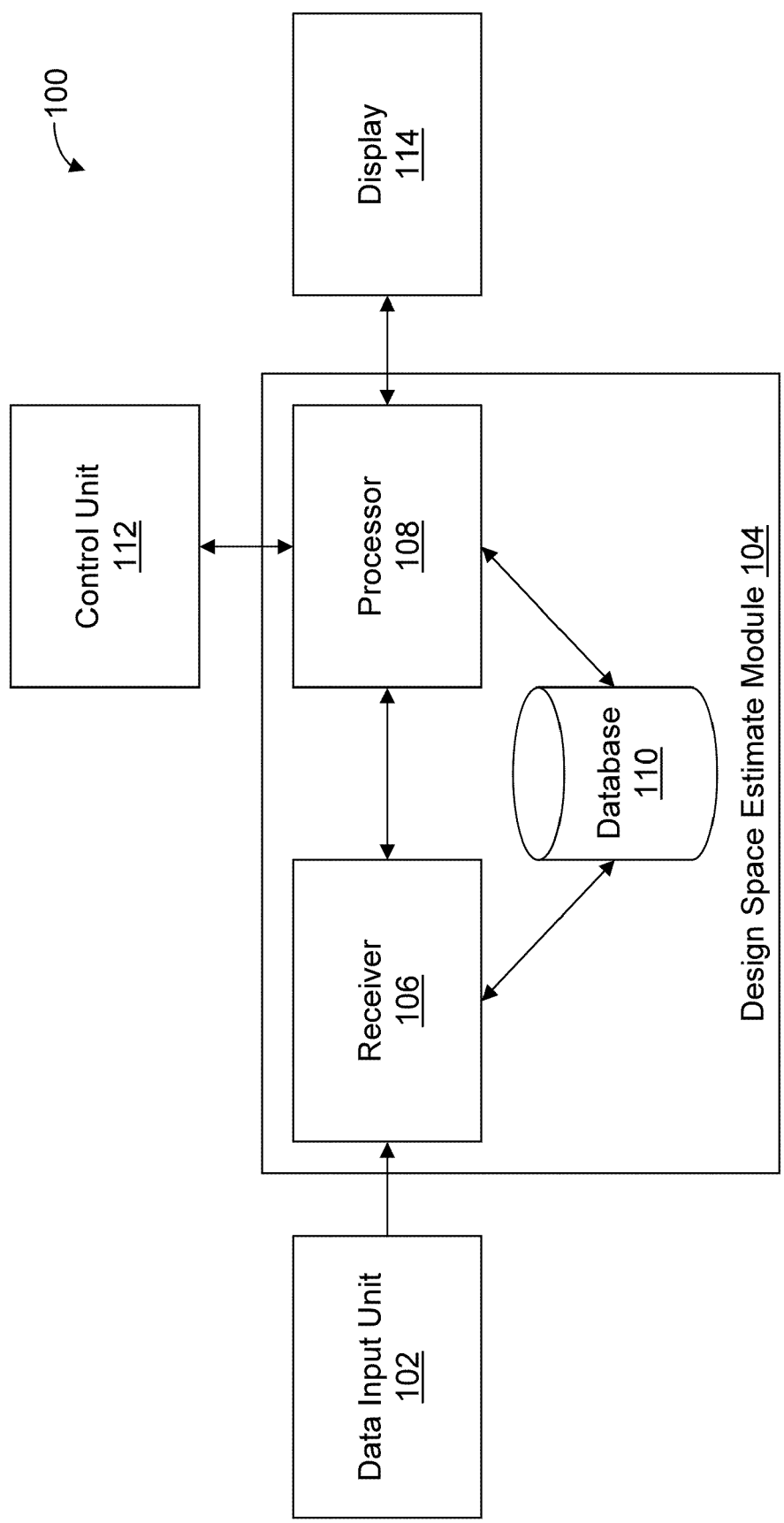
FIG. 1 is a schematic illustration of a system for predicting an automated predictive design space estimate, according to an illustrative embodiment of the invention.

FIG. 1 is a schematic illustration of a system 100 for performing automated predictive design space estimate, according to an illustrative embodiment of the invention. The system includes a data input unit 102. The data input unit 102 transmits data to the design space estimate module 104. The design space estimate module 104 includes a receiver 106. The receiver 106 is in communication with a processor 108. The receiver 106 and the processor 108 are in communication with a database 110. The processor 108 is in communication with a control unit 112. The processor 108 is also in communication with a display 114.

A user inputs data (e.g., input factor data and output response data) for a process through the data input unit 102 (e.g., a keyboard or a computer), which the design space estimate module 104 uses to calculate the PDSE. In one example, starting criteria are configured through the control unit 112, which are used by the design space estimate module 104 while calculating the PDSE. The starting criteria include, for example, a target response criterion for each of the one or more output responses. The target response criterion specifies the desired outcome for each of the one or more output responses. For example, if an output response is fuel consumption and the target response criterion is 220 mg/stroke, the design space estimate module 104 designs the PDSE so that the largest region of variability for each of the input factors best satisfies the target response criterion of 220 mg/stroke. In some embodiments, the target response criteria is a target response value (e.g., fuel consumption equals 220 mg/stroke), a range of acceptable target response values (e.g., fuel consumption between 200 mg/stroke and 240 mg/stroke), or a critical response value, where the output response can either be above or below the critical target response value (e.g., either above or below 220). In some embodiments, the design space estimate module 104 retrieves data from the database 110 instead of directly from a user. In one embodiment, data acquired from a user input (e.g., the data input unit 102) or from a computer system is stored in the database and subsequently provided to the receiver to allow a user to store data for later use by the design space estimate module 104.

In some embodiments, a number of experiments are run for the physical process (e.g., industrial process, manufacturing process, or design project) before generating the PDSE. The experiments can be designed by application specialists who can determine what input factors and output responses should be included in the design. These experiments are used to test the relationship between the input factors and the output responses for the system. For example, the experiments can run the process or problem for various combinations of input factor values to determine what output response values are generated by the combinations. This data provides known outcomes for the output responses based on known combinations of the input factors. A user inputs the experimental data through the data input unit.

The design space estimate module 104 preprocesses the data received by the receiver 106. The design space estimate module 104 calculates an estimated optimal value for each of the one or more input factors that achieves the target response criteria. For example, the calculation can be carried out via a simplex search. Or the design space estimate module 104 can use a penalty function. The design space estimate module 104 sets constraints for the output responses (e.g., a target and a high/low limit). For each set of results for a particular combination of input factor values, the penalty term grows when the constraints are violated, or achieves 0 in the region where the constraints are not violated.

The design space estimate module 104 is configured to calculate a PDSE with multiple output responses. Further, the design space estimate module 104 can calculate one PDSE model across the output responses, or calculate multiple PDSE models across the output responses. The preprocessed data only provides one estimated optimal value for each of the one or more input factors that achieve the target response criterion. The design space estimate module 104, using the estimated optimal values in combination with the other data for the process (e.g., the input factor values, output response values, and constraints), calculates a largest region of variability for the one or more input factors where the criteria are fulfilled (the PDSE). For example, if a user would like to run a process at a known temperature, the largest region of variability for the PDSE provides the tolerance ranges for the input factors (e.g., pressure, gas flow).

The data input unit 102, the design space estimate module 104, and the control unit 112 can be implemented in digital electronic circuitry, in computer hardware, firmware, and/or software implemented with a processor. The implementation can, for example, be a programmable processor, a computer, and/or multiple computers. While FIG. 1 illustrates the data input unit 102, the design space estimate module 104, and the control unit 112 as separate components, one skilled in the art can appreciate that the functionality of one or more of these components can be combined.

Figure 2:
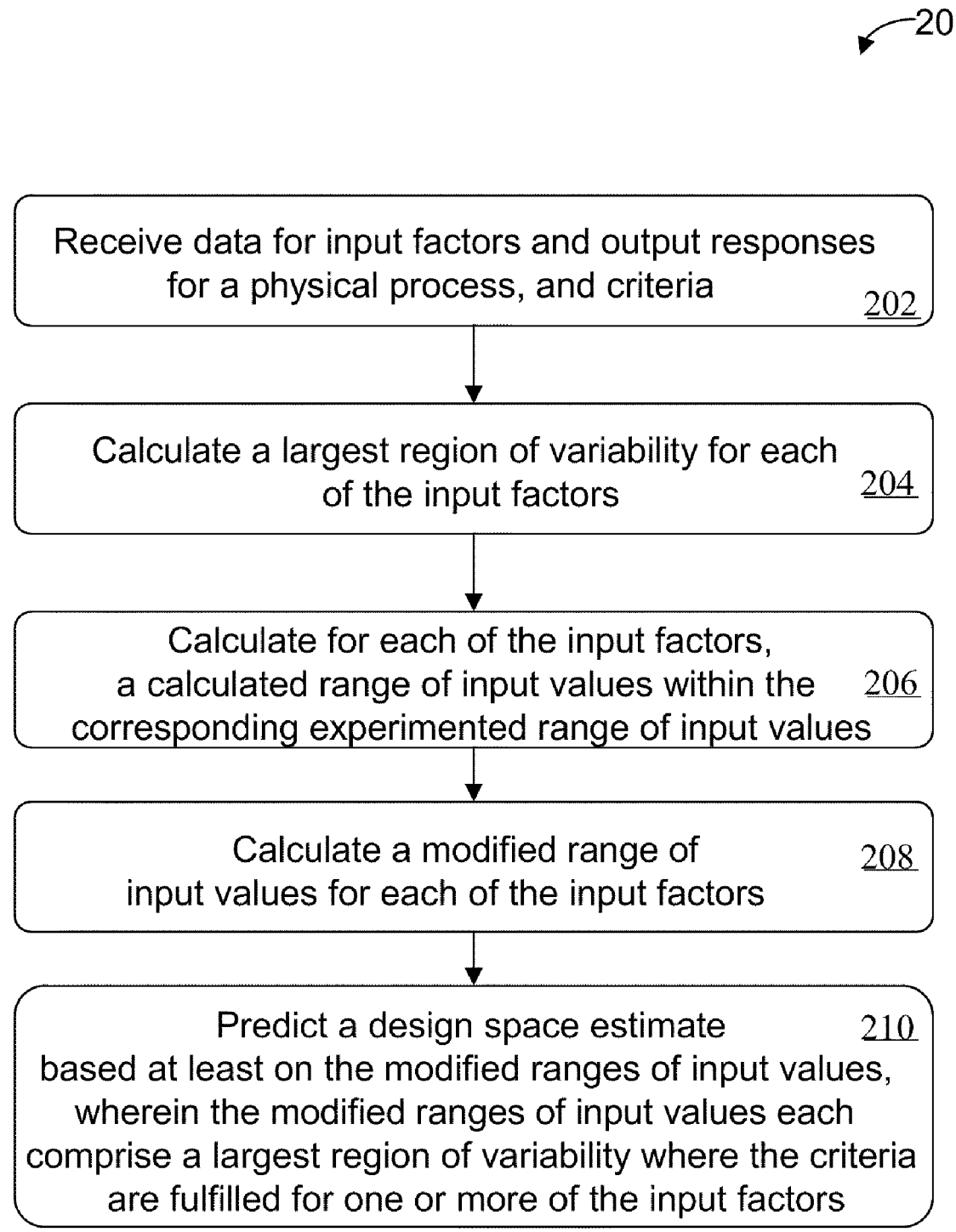
FIG. 2 is a flow chart illustrating a method for predicting an automated predictive design space estimate, according to an illustrative embodiment of the invention.

FIG. 2 is a flow chart illustrating a computerized method 200 for performing automated predictive design space estimate, according to an illustrative embodiment of the invention. Step 202 involves receiving data (e.g., via the processor 108). The data includes data for one or more input factors for a manufacturing or industrial process, one or more output responses for the process, and criteria. In some embodiments, the criteria includes a target response criterion for each of the one or more output responses, an estimated optimal value for each of the one or more input factors to achieve the target response criteria, and an experimented range of input values for each of the one or more input factors, where each input value in the experimented range of input values is determinative of an output response value for each of the one or more output responses.

At step 204, the design space estimate module 104 calculates a largest region of variability for each of the one or more input factors. At step 206, the design space estimate module 104 calculates (e.g., using the processor 108), for each of the one or more input factors, a calculated range of input values within the corresponding experimented range of input values. At step 208, the design space estimate module 104 calculates (e.g., using the processor 108) a modified range of input values for each of the one or more input factors. At step 210, the design space estimate module 104 predicts a design space estimate based at least on the modified ranges of input values, wherein the modified ranges of input values each comprise a largest region of variability for one or more of the input factors where the criteria are fulfilled.

With respect to step 202, the largest region of variability is calculated with a stepwise expansion of a percentage (e.g., 2.5%) of the input factor range. The input factor range is the region of values of each input factor for which an experiment was conducted as described above. The design space estimate module 104 expands the input factor range by a percentage and performs Monte Carlo simulations to predict output response values. The design space estimate module 104 stops the stepwise expansion of the factor range when the predicted output response values are met for one or more of the output responses. The stepwise expansion is done for each of the one or more input factors on a one-by-one basis. The calculated largest region of variability for each input factor is used as the starting criteria for the search (steps 206 and 208) of the combined largest region of variability of the input factors where all input factors can vary and still fulfill the output response specifications.

Steps 206 and 208 calculate the combined largest region of variability of the input factors where all input factors can vary and still fulfill the output response specifications. With respect to step 206, the design space estimate module 104 calculates the calculated range of input values for all the input factors together (simultaneously). Step 206 is described in further detail with reference to FIG. 3A. With respect to step 208, the design space estimate module 104 calculates the modified range of input values for each input factor on a one-by-one basis. Step 208 is described in further detail with reference to FIG. 3B.

With respect to step 210, the design space estimate module 104 can use different mathematical regression models for each output response to estimate the largest range of variability (e.g., for all input factors individually or for all of the input factors in combination, the PDSE) with Monte Carlo simulations. The design space estimate module 104 automatically calculates the PDSE using prespecified criteria. The criteria include, for example, specific distributions (e.g., a normal distribution or a triangular distribution), user set criteria on input factors and/or output responses (e.g., user defined limits on specific input factors, user defined input factor distributions), technical constraints (e.g., for mixture designs, the sum of all input factors should always equal one). In some examples, constraints such as qualitative input factor settings (e.g., "good" and "bad") or discrete input factor settings (e.g., "low", "medium", or "high"), can not be processed (e.g., the qualitative input factors can not be randomized as required for the repeated computations of Monte Carlo simulations) in the same way as a continuous input factor. Functions can be included to perform calculations (e.g., Monte carlo simulations) with random settings of qualitative input factors. An exemplary function is a random setting for the qualitative input factor, where the distribution can be set to specific probabilities (e.g., 60% of A, 30% of B, and 10% of C) as a constraint (e.g., by assuming that the random population of discrete settings for the input factor has the final distribution set by the constraint). In some embodiments, for technical constraints for mixtures, the design space estimate module 104 normalizes the input factors each time after the random variation is added for the Monte Carlo simulation so the sum of all the input factors equals a constant (e.g., one).

Figure 3A:
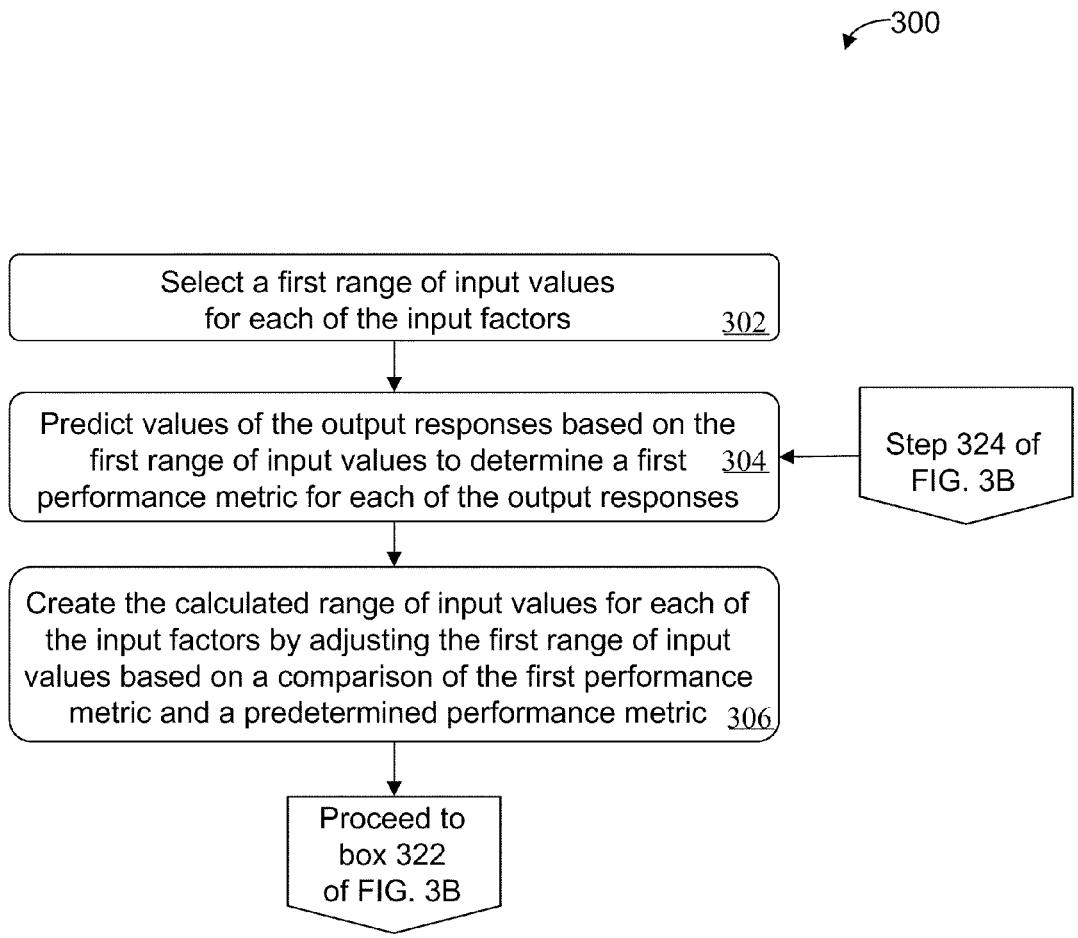
FIG. 3A is a flow chart illustrating a method for calculating a calculated range of input values, according to an illustrative embodiment of the invention.

FIG. 3A is a flow chart illustrating a method 300 for calculating a calculated range of input values, according to an illustrative embodiment of the invention. At step 302, the design space estimate module 104 (e.g., using the processor 108) selects a first range of input values for each of the one or more input factors. At step 304, the design space estimate module 104 predicts values of the one or more output responses based on the first range of input values to determine a first performance metric for each of the one or more output responses. At step 306, the design space estimate module 104 creates the calculated range of input values for each of the one or more input factors by adjusting the first range of input values based on a comparison of the first performance metric and a predetermined performance metric.

With respect to step 302, the design space estimate module 104 sets the first range to a percentage (e.g., 75%) of the largest region of variability for each input factor. With respect to step 304, the design space estimate module 104 performs Monte Carlo simulations with a number of samples specified by the user (e.g., a setting stored in the database 110). Monte Carlo simulations, or methods, are computational methods that rely on repeated random sampling to compute their results to simulate physical (and mathematical) systems. Monte Carlo simulations are often used when it is unfeasible or impossible to compute an exact result with a deterministic algorithm. Generally, a Monte Carlo simulation involves first defining a domain of possible inputs (e.g., input factors for a physical process). Inputs (or input factor values) are generated randomly from the domain (the physical process). A deterministic computation is performed using the inputs (e.g., comparing the output response values to the desired criteria for the output response values). Lastly, the results of the individual deterministic computations are aggregated into the final result (e.g., the PDSE).

In some embodiments, the first performance metric is a criterion called a dots per million operations (DPMO). The DPMO is the number of calculated output response values that are outside the specification limit range for a particular output response. The specification limit range (which can be defined by a user) begins at a lower output response value and ends at an upper output response value, defining a range of acceptable output response values for an output response. The Monte Carlo simulations are run and the predicted output response values are compared against the DPMO to determine whether the selected first range of values is acceptable. For example, a DPMO of 50,000 hits outside the limits for a particular output response is 50,000/1,000,000=0.05 or 5%, which allows for 5% of the predicted output response values to fall outside of the specification limit range and still be considered acceptable performance.

With further respect to step 304, in some embodiments, a random error is added to each input factor based on the selected distribution for the Monte Carlo simulation (e.g., a normal distribution, a uniform distribution, or a triangular distribution) and ranges (e.g., the first range) to improve the robustness of the Monte Carlo simulation. In some embodiments, a random error based on the Monte Carlo model error is added to each predicted output response value (e.g., a Student's t-distribution random error).

Figure 3B:
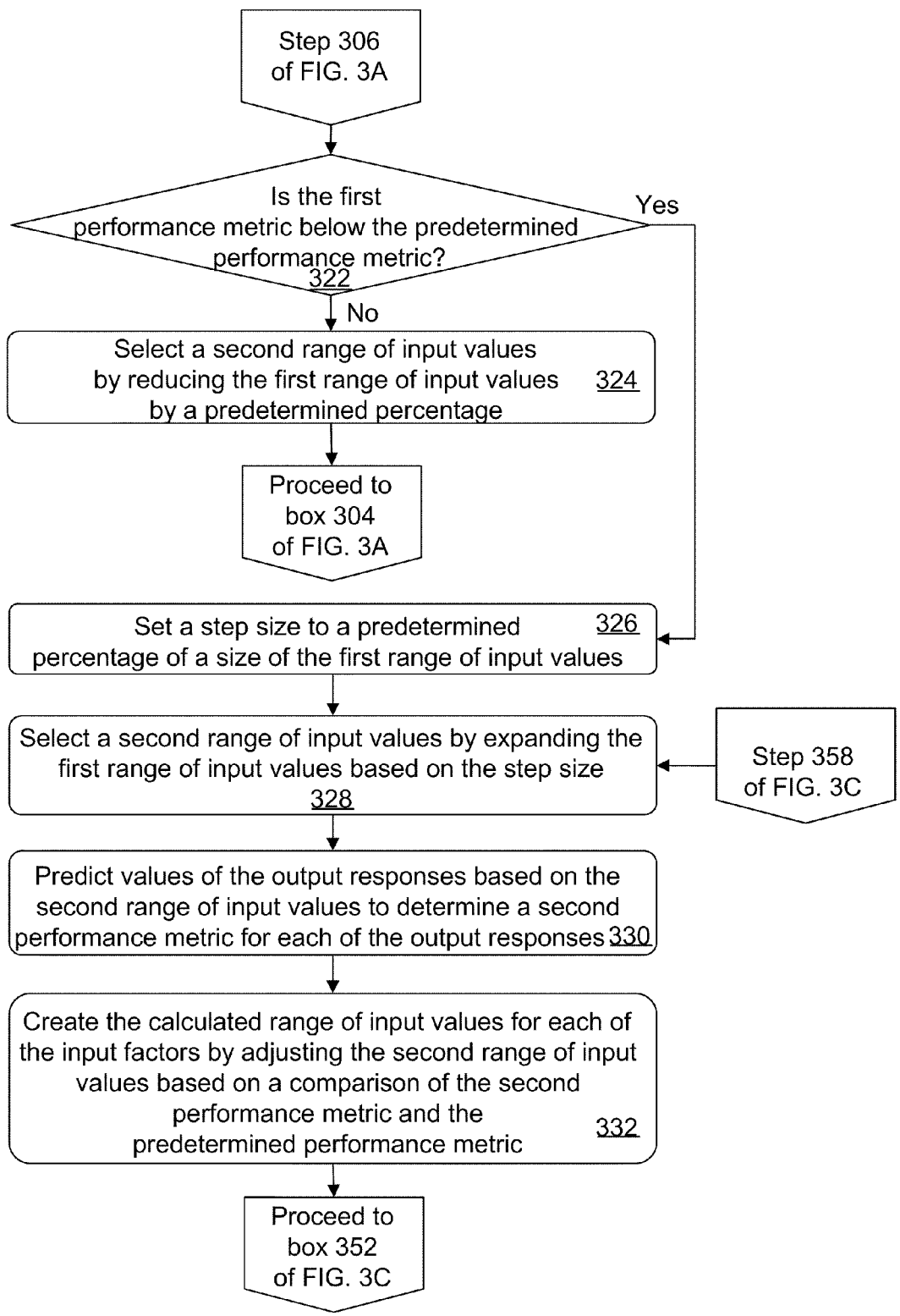
FIG. 3B is a flow chart illustrating a method for a stepwise region expansion for calculating a calculated range of input values, according to an illustrative embodiment of the invention.

With respect to step 306, the design space estimate module 104 creates the calculated range based on a comparison of the first performance metric and a predetermined performance metric. For example, the design space estimate module 104 compares the calculated DPMO for the Monte Carlo simulations (from step 304) to a prespecified DPMO (e.g., DPMO=50,000). The comparison of the first performance metric and the predetermined performance metric is described in FIG. 3B. FIG. 3B is a flow chart illustrating a portion of the method 300 for a stepwise region expansion for calculating the calculated range of input values, according to an illustrative embodiment of the invention. At step 322, the first performance metric is compared to the predetermined performance metric. If the first performance metric is above the predetermined metric, the method 300 proceeds to step 324. At step 324, the design space estimate module 104 Select a second range of input values by reducing the first range of input values by a predetermined percentage. For example, if the DPMO is larger than the specified DMPO limit, the first range is divided by two. After selecting the second range of input values, method 300 proceeds to step 304 of FIG. 3A.

If the first performance metric is below the predetermined metric, the method 300 proceeds to step 326. At step 326, the design space estimate module 104 sets a step size to a predetermined percentage of a size of the first range of input values. At step 328, the selects a second range of input values by expanding the first range of input values based on the step size. At step 330, the design space estimate module 104 predicts values of the one or more output responses based on the second range of input values to determine a second performance metric for each of the one or more output responses. At step 330, the design space estimate module 104 creates the calculated range of input values for each of the one or more input factors by adjusting the third range of input values based on a comparison of the third performance metric and the predetermined performance metric.

With respect to steps 326 and 328, the design space estimate module 104 can set the step size to 20% of the first range of input values, selecting the second range of input values by expanding the first range by the step size. With respect to step 330, the design space estimate module 104 can perform Monte Carlo simulations as described above with reference to step 304 of FIG. 3A to determine a DPMO for each of the one or more output responses.

Figure 3C:
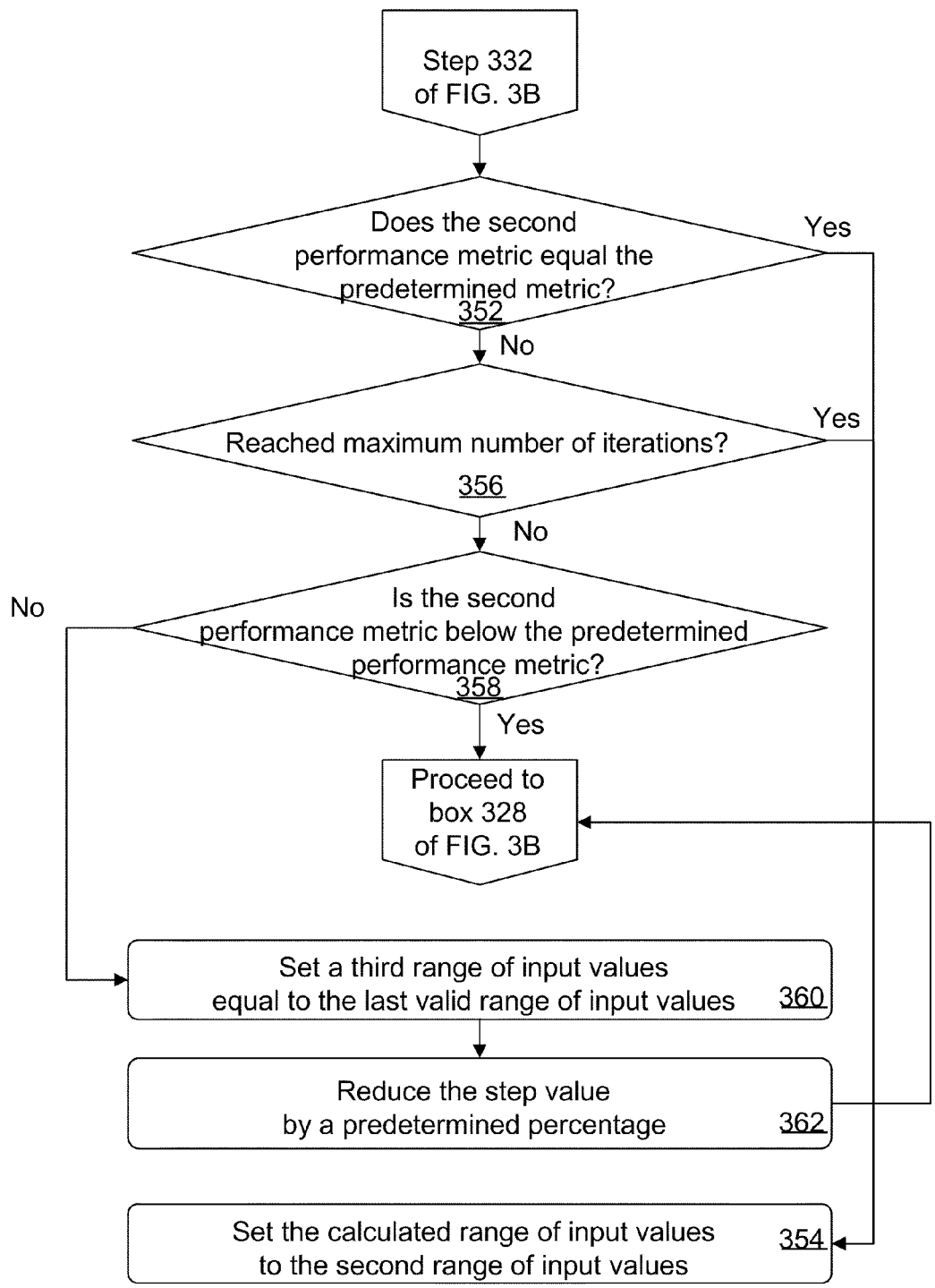
FIG. 3C is a flow chart illustrating a method for a stepwise region expansion for calculating a calculated range of input values, according to an illustrative embodiment of the invention.

With respect to step 332, the calculated range is created by adjusting the second range of input values based on a comparison of the second performance metric and the predetermined performance metric as described in FIG. 3C. FIG. 3C is a flow chart illustrating a portion of the method 300 of FIG. 3A for a stepwise region expansion for calculating a calculated range of input values, according to an illustrative embodiment of the invention. At step 352, the design space estimate module 104 determines whether the second performance metric equal the predetermined metric. If the second performance metric equals the predetermined metric, the method 300 proceeds to step 354. At step 354, the design space estimate module 104 sets the calculated range of input values to the second range of input values.

If the second performance metric does not equal the predetermined metric, the method 300 proceeds to step 356. At step 356, the design space estimate module 104 determines whether the method has reached a maximum number of iterations. If the maximum number of iterations has been reached, the method proceeds to step 354 and sets the calculated range of input values to the second range of input values. If the maximum number of iterations has not been reached, the method proceeds to step 358. Steps 352 and 356 are termination criteria to prevent the method 300 of FIGS. 3A-3C from infinitely looping. At step 358, the design space estimate module 104 determines if the second performance metric is below the predetermined performance metric. If the second performance metric is below the predetermined performance metric, the method 300 proceeds to step 328 of FIG. 3B. If the second performance metric is not below the predetermined performance metric, the method proceeds to step 360. At step 360, the design space estimate module 104 sets a third range of input values equal to the last valid range of input values (the last range of input values that was associated with a performance metric below the predetermined performance metric). At step 362, the design space estimate module 104 reduces the step value by a predetermined percentage. The method 300 continues to box 328 of FIG. 3B, selecting a fourth range of the input values by expanding the third range of input values based on the step size, and so on.

For example, with reference to the portion of method 300 shown in FIG. 3C, if the DPMO is less than the DPMO limit, the design space estimate module 104 continues to expand and test the range until one or more of the termination criteria are satisfied (steps 352 and 356). If the DPMO is higher than the DPMO limit, the design space estimate module 104 shrinks the factor range back to the last valid setting (step 360) (e.g., the first range), divides the step size by two (step 362), and continues to expand and test the range until one or more the termination criteria are satisfied (steps 328 of FIG. 3B and on as described with reference to FIG. 3B). Method 300 terminates either when the calculated range achieves the desired DPMO for the Monte Carlo simulations of the calculated range, or the maximum number of iterations occurs, resulting on the best calculated range achievable for expanding all of the one or more input factors at the same time.

Figure 4A:
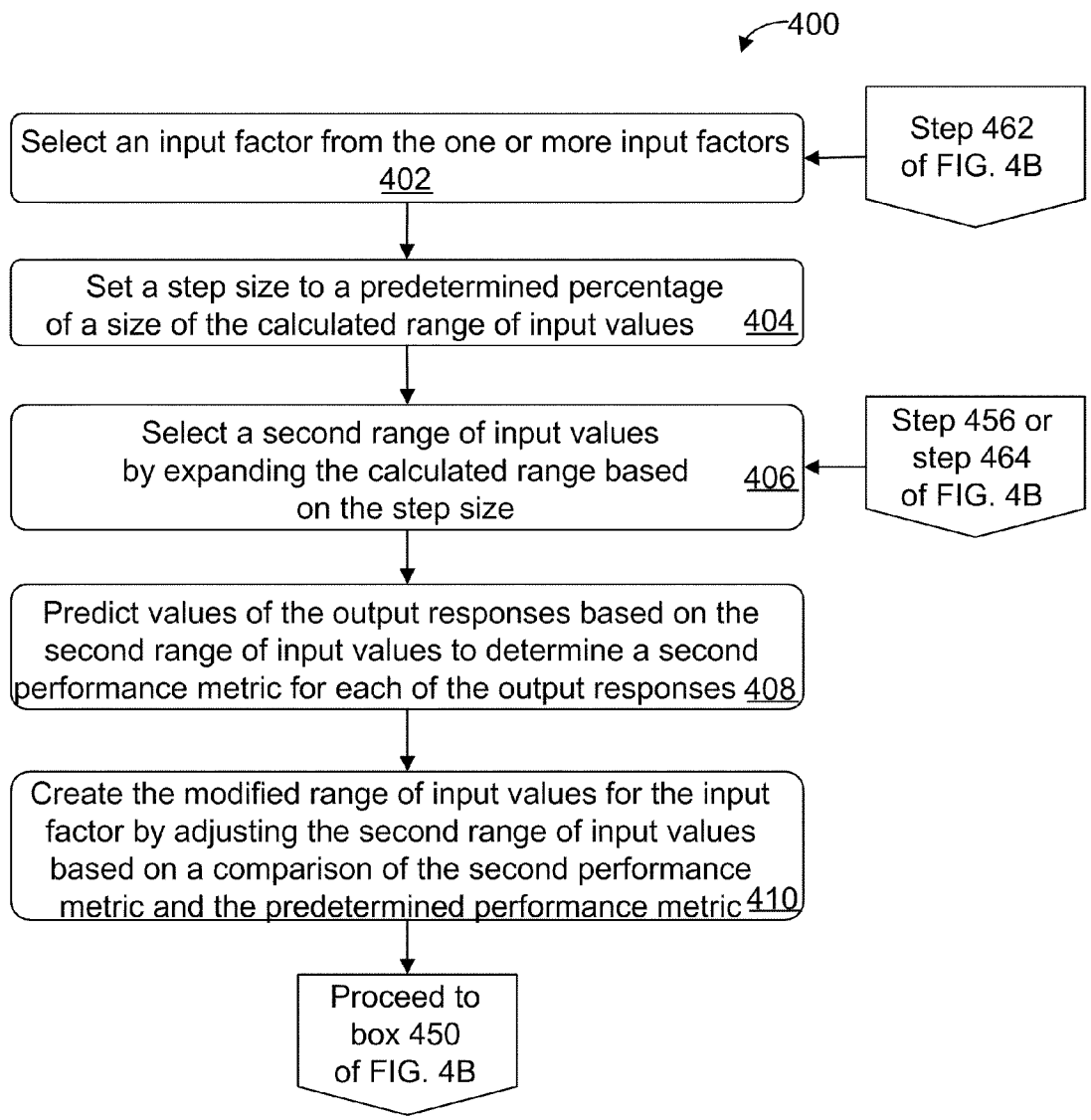
FIG. 4A is a flow chart illustrating a method for calculating a modified range of input values, according to an illustrative embodiment of the invention.

FIG. 4A is a flow chart illustrating a method 400 for calculating a modified range of input values, according to an illustrative embodiment of the invention. At step 402, the design space estimate module 104 selects an input factor from the one or more input factors. At step 404, the design space estimate module 104 sets a step size to a predetermined percentage of a size of the calculated range of input values. At step 406, the design space estimate module 104 selects a second range of input values by expanding the calculated range based on the step size. At step 408, the design space estimate module 104 predicts values of the one or more output responses based on the second range of input values to determine a second performance metric for each of the one or more output responses. At step 410, the design space estimate module 104 creates the modified range of input values for the input factor by adjusting the second range of input values based on a comparison of the second performance metric and the predetermined performance metric.

Figure 4B:
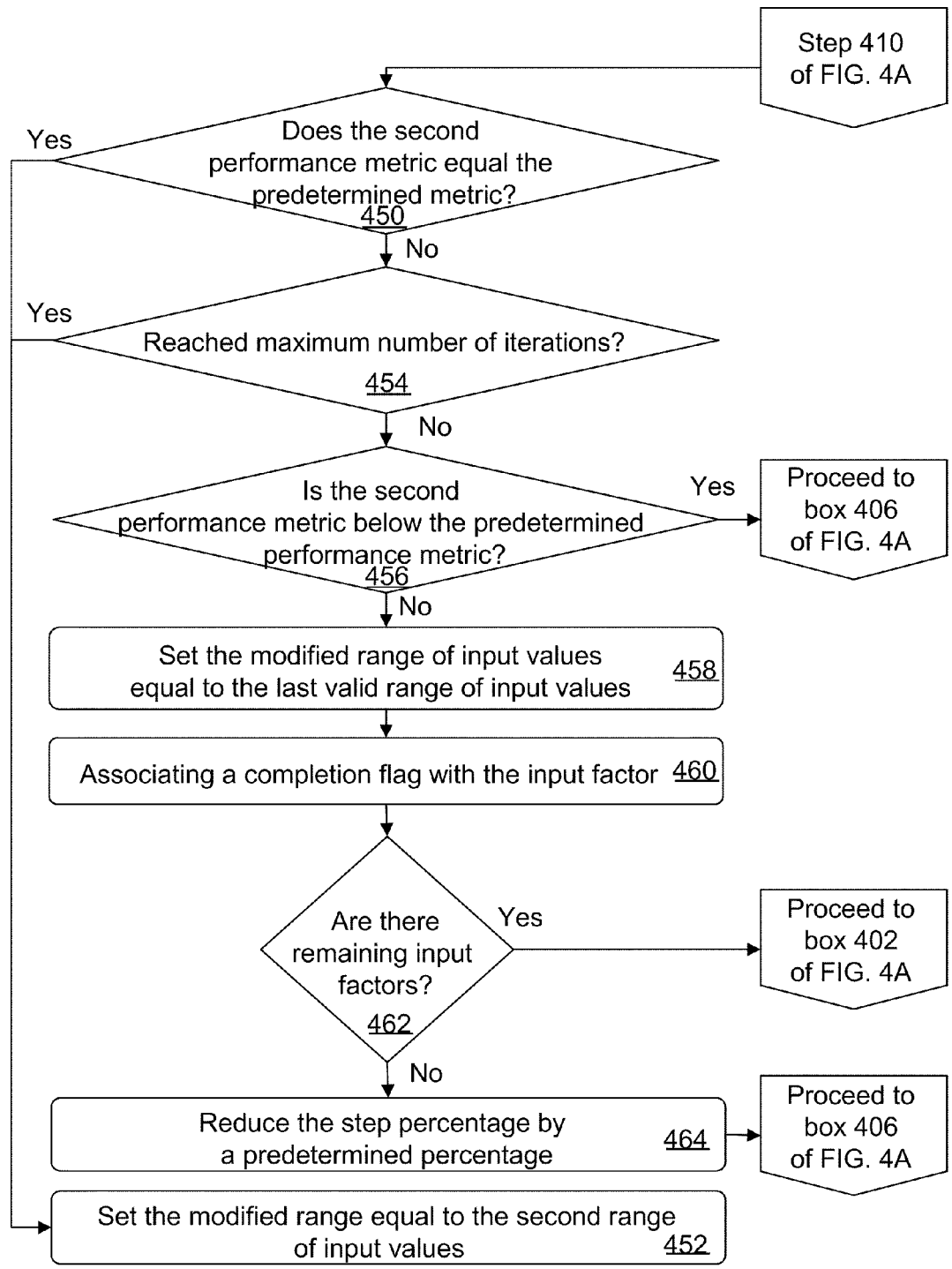
FIG. 4B is a flow chart illustrating a method for a stepwise region expansion for calculating a modified range of input values, according to an illustrative embodiment of the invention.

With respect to step 410, the modified range is created based on a comparison of the second performance metric and the predetermined performance metric as shown in FIG. 4B. FIG. 4B is a flow chart illustrating a portion of the method 400 for a stepwise region expansion for calculating a modified range of input values, according to an illustrative embodiment of the invention. At step 450, the design space estimate module 104 determines whether the second performance metric equals the predetermined metric. If the second performance metric equals the predetermined metric, the method proceeds to step 452. At step 452, the design space estimate module 104 sets the modified range equal to the second range of input values. If the second performance metric does not equal the predetermined metric, the method proceeds to step 454.

At step 454, the design space estimate module 104 determines whether method 400 has reached a maximum number of iterations. If the maximum number of iterations has been reached, method 400 proceeds to step 452 and sets the modified range to the second range of input values. If the maximum number of iterations has not been reached, the method proceeds to step 456. Steps 450 and 454 are termination criteria to prevent the method 400 of FIGS. 4A-4B from infinitely looping. At step 456, the design space estimate module 104 determines whether the second performance metric is below the predetermined performance metric. If the second performance metric is below the predetermined metric, the method 400 proceeds to box 406 of FIG. 4A. If the second performance metric is not below the predetermined metric, the method 400 proceeds to step 458. At step 458, the design space estimate module 104 sets the modified range of input values equal to the last valid range of input values (the last range of input values that was associated with a performance metric below the predetermined performance metric). At step 460, the design space estimate module 104 associates a completion flag with the input factor.

At step 462, the design space estimate module 104 determines whether there are remaining input factors from the one or more input factors that do not have a completion flag associated with the input factor. If there are remaining input factors, the method proceeds to box 402 of FIG. 4A. If there are not any remaining input factors, the method 400 proceeds to step 464. At step 464, the design space estimate module 104 reduces the step percentage by a predetermined percentage, and continues to box 406 to select a new range of input values by expanding the second range of input values based on the modified step size, and so on.

For example, the method 400 is performed individually on each of the one or more input factors (step 402). The design space estimate module 104 sets the step size to 20% of the factor range (20% of the calculated range of input values) of the input factor (step 404). The design space estimate module 104 expands the factor range of the input factor with the step size (e.g., adds the step size to the current factor range of the input factor) (step 406). The design space estimate module 104 performs Monte Carlo simulations as described above, adding in random errors if appropriate (step 408). If the DPMO is higher than the DPMO limit, the design space estimate module 104 shrinks the factor range of the input factor back to the last setting of the factor range with a DPMO below the DPMO limit (456), and associate the input factor with a completion flag. If the DPMO is lower than the DPMO limit, the method (method 400) is repeated by expanding the factor range and comparing the resulting DPMO for the Monte Carlo simulations (repeat steps 406 through 410, where step 410 includes steps 450 through 464). The process is repeated for all of the remaining input factors until they are all associated with a completion flag. Then the design space estimate module 104 clears the completion flags from the input factors, divides the step size by a predetermined amount (e.g., divides the step size by two), and repeats the method (e.g., repeats steps 406 through 410).

Referring back to FIG. 2, in some embodiments, after the calculated range is calculated for the one or more input factors at the same time (e.g., via method 300 of FIGS. 3A-3C), a modified range is calculated individually for each of the input factors (e.g., via method 400 of FIGS. 4A-4B), and the PDSE is calculated with a large number of Monte Carlo simulations for better precision of the PDSE. The predetermined performance metric (e.g., the limiting value) for the Monte Carlo simulations is the DPMO. The DPMO is, for example, the highest DPMO value tolerated for an individual output response, or the highest DPMO value for all of the output responses. In some examples other limiting criteria are used instead of DPMO, such as a percentage outside of the specification limit range for the output responses, a process capability index (Cpk), or medians and quartiles of the output responses.

As an illustrative example not intended to be limiting, in one implementation of the invention, a user desires to optimize the operation of a car engine for the output responses of fuel consumption (fuel) measured in mg/stroke, nitrogen oxide emission (NOx) measured in mg/sec and soot emission (soot) measured in mg/sec. The three input factors that can be controlled for this example are air intake (air) measured in kg/h, exhaust gas recirculation percentage (EGR %, which is a NOx reduction technique that works by recirculating a portion of an engine's exhaust back to the engine cylinders), and needlelift (NL) measured in degrees before top deadcentre (°BTDC). The design space estimate module 104 predicts a PDSE for the engine based on these three input factors and three output responses to provide a measure of how much the three input factors can be varied (e.g., either individually or simultaneously) while still fulfilling the criteria for the three output responses. To ensure the model is valid, a user can set specific regions on which to perform the calculations, the experimented range of input values (e.g., steps 204, 206 and 208 of FIG. 2). For this example, the calculations are performed on air between 240 kg/h and 284 kg/h, EGR % between 6% and 12%, and NL between −5.78 °BTDC and 0 °BTDC. There are criteria for the output responses. The specification limit range for fuel is between a minimum output response value of 200 mg/stroke to a maximum output response value of 240 mg/stroke. The specification limit range for NOx is up to 25 mg/sec (e.g., there is no minimum value for the specification limit, which is zero in this example). The specification limits for soot is up to 0.5 mg/sec. Fuel has a target response value of 220 mg/stroke, NOx has a target response value of 10 mg/sec, and soot has a target response value of 0.2 mg/sec.

The design space estimate module 104 (or a user) estimates how the input factors effect the output responses by developing mathematical functions of the relation between the input factor settings (X) and the output response (Y), y=f(x). Each mathematical function is the expected output response as a function of the different input factors. This is performed, for example, with a design of experiments protocol. In this example, a classical series of experiments (using Central Composite Design (CCD)) with 17 experiments was performed. From those experiments, three different models, one for each response Y, were calculated (e.g., via multiple linear regression (MLR)). Tables 1-3 below show three exemplary linear regression models for each response.

TABLE 1

| Fuel | Coeff. SC | Std. Err. | P | Conf. int (±) |
|---|---|---|---|---|
| Constant | 243.042 | 0.77712 | 7.68757e−025 | 1.69319 |
| Air | 8.78614 | 0.674565 | 1.93059e−008 | 1.46974 |
| EGR | 2.66658 | 0.656038 | 0.00156851 | 1.42938 |
| NL | −12.2052 | 0.646809 | 2.74769e−010 | 1.40927 |
| Air * Air | −5.716 | 1.08892 | 0.00020466 | 2.37255 |

Table 1 shows an exemplary regression model for fuel. Column one, labeled "Fuel" includes the different components of the model, which are the constants, air, EGR, needlelift (NL), and air×air. Column two, labeled "Coeff. SC" (coefficients, scaled and centered), includes a coefficient for each fuel component. Column three, labeled "Std. Err." (standard error), includes a standard error for each fuel component. Column four, labeled "P" (probability for P test), includes a P value for each fuel component. Column five, labeled "Conf. Int (±)" includes a confidence interval for each fuel component. A confidence interval is a statistics term used to indicate the reliability of an estimate. The confidence interval is used to get to, for example, 95% confidence interval (e.g., air is 8.78614±1.46984).

The regression model for fuel also includes the following parameters. The number (N) of CCF experiments is 17. The degree of freedom (DF) is 12 (17 experiments minus 5 entries in the table). Performance measurements include $Q^2=0.958$, $R^2=0.979$, $R^2$ Adj.=0.972, and cond. no. (a measure of the quality of the experimental design used)=2.978. The closer the performance measurements are to one (1.0), the stronger the correlation is between the input factors and the output responses. Other performance measurements include Y−miss=0, which is the number of missing values or measurements. The residual standard deviation (RSD) is 2.0249, which is connected to $R^2$, where the closer $R^2$ is to one, then the closer RSD is to zero. The confidence level of the model is 0.95.

TABLE 2

| NOx | Coeff. SC | Std. Err. | P | Conf. int (±) |
|---|---|---|---|---|
| Constant | 19.4543 | 0.200454 | 6.63998e−015 | 0.453461 |
| Air | 0.816983 | 0.152378 | 0.00045539 | 0.344707 |
| EGR | −7.77984 | 0.148415 | 1.68126e−012 | 0.335741 |
| NL | 1.93977 | 0.146473 | 3.31136e−007 | 0.331349 |
| Air * Air | −0.571193 | 0.298143 | 0.087639 | 0.674452 |
| EGR * EGR | 1.29447 | 0.283578 | 0.001357 | 0.641503 |
| NL * NL | 0.812071 | 0.283058 | 0.0185093 | 0.640327 |
| EGR * NL | −0.941485 | 0.166246 | 0.000308381 | 0.376079 |

Table 2 shows an exemplary regression model for NOx. Column one, labeled "NOx" includes the different components of the model, which are the constants, air, EGR, NL, air×air, EGR×EGR, NL×NL, and EGR×NL. Table 2 includes the same four remaining columns as Table 1, namely "Coeff. SC", "Std. Err.", "P", and "Conf. Int (±)". The parameters for the NOx regression model are N=17, DF=12, $Q^2=0.987$, $R^2=0.997$, $R^2$ Adj.=0.995, cond. no.=4.498, Y-miss=0, RSD=0.4624, and the confidence level of the model is 0.95.

TABLE 3

| Soot | Coeff. SC | Std. Err. | P | Conf. int (±) |
|---|---|---|---|---|
| Constant | −0.279945 | 0.0288614 | 2.56008e−007 | 0.0623513 |
| Air | −0.157893 | 0.0389473 | 0.00136603 | 0.0841406 |
| EGR | 0.46588 | 0.0380323 | 1.6319e−008 | 0.0821639 |
| NL | 0.283157 | 0.0375012 | 4.18648e−006 | 0.0810165 |

Table 3 shows an exemplary regression model for soot. Column one, labeled "soot" includes the different components of the model, which are the constants, air, EGR, and NL. Table 3 includes the same four remaining columns as Table 1, namely "Coeff. SC", "Std. Err.", "P", and "Conf. Int (±)". The parameters for the soot regression model are N=17, DF=12, $Q^2=0.987$, $R^2=0.997$, $R^2$ Adj.=0.995, cond. no.=4.498, Y-miss=0.4624, and the confidence level of the model is 0.95.

The estimated optimal value is calculated for each input factor that gives a predicted output response value that is the smallest distance to the target response criterion for each of the output responses. These estimated optimal values are the start points for the PDSE calculations. The largest region of variability is calculated for air, EGR and needlelift (e.g., step 204 of FIG. 2). In some examples, the calculation is built to assume that each input factor varies with a normal distribution around its specific estimated optimal value.

Figure 5A:
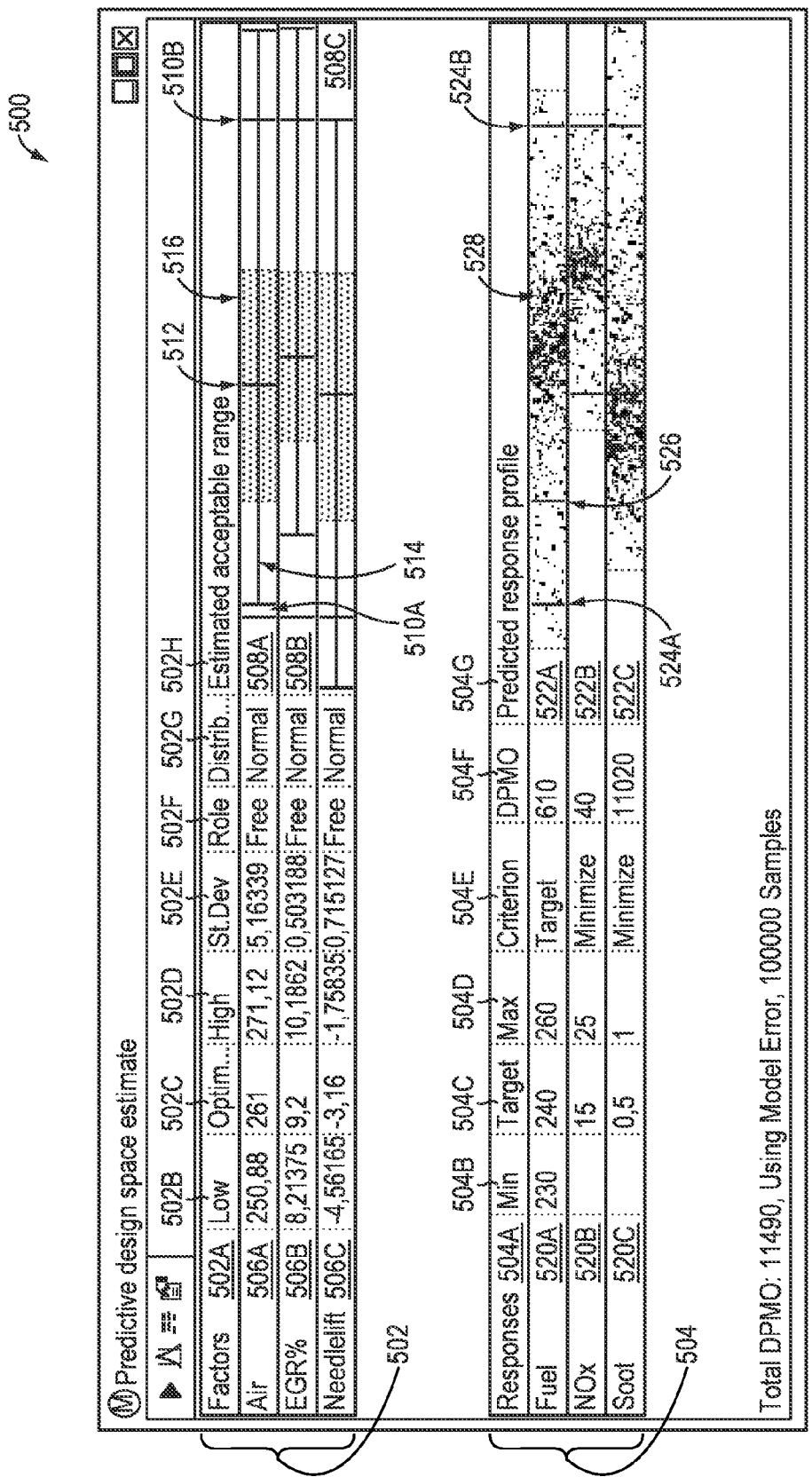
FIG. 5A is a diagram illustrating a graphical display for displaying an automated predictive design space estimate, according to an illustrative embodiment of the invention.

FIG. 5A is a diagram illustrating a graphical display 500 for displaying an automated predictive design space estimate, according to an illustrative embodiment of the invention. In FIGS. 5A-C and 5E, while some of the numerical entries are displayed with commas, other numbering conventions can be used. For example, the U.S. convention of using decimals can be used in place of commas (e.g., 250,88 is equivalent to 250.88, and either convention can be used when displaying values in the graphical displays of the system). Display 500 includes an input factor table 502 and an output response table 504. The input factor table 502 includes eight columns, the input factor column 502A, the low column 502B, the optimum column 502C, the high column 502D, the standard deviation column 502E, the role column 502F, the distribution column 502G, and the estimated acceptable range column 502H. The input factor column 502A displays the input factors for the PDSE. The low column 502B displays a value for each input factor that is the lowest input factor value of the combined largest region of variability. The optimum column 502C displays a value for each input factor that is the estimated optimal value for each input factor. The high column 502D displays a value for each input factor that is the highest input factor value of the combined largest region of variability. The standard deviation column 502E lists the standard deviation for the input factors in the PDSE. The role column 502F displays the role of the input factor (locked or free). The distribution column 502G displays the distribution of the model. The input factor table 502 includes a row for each input factor air 506A, EGR % 506B and needlelift 506C, collectively input factor rows 506, which are listed in input factor column 502A. The estimated acceptable range column 502H includes a graph 508A, 508B and 508C for each input factor row 506A, 506B and 506C, respectively (collectively, graphs 508).

Each graph 508 in the estimated acceptable range column 502H includes an experimental region of input values, with a low value 510A a high value 510B, generally the experimented region of input values 510. Each graph 508 includes an estimated optimal value 512, which is indicated in the optimum column 502C for each input factor row 506 (e.g., the air input factor row 506A has an estimated optimal value 512 of 261 kg/h). The estimated optimal value 512 is the input factor value for each input factor that best estimates the target response criterion for each output factor. Each graph 508 includes an individual largest region of variability 514 for each input factor row 506A, which is the region of values for the associated input factor that satisfy the PDSE while any remaining input factors are set to their associated estimated optimal value. Each graph 508 includes a combined largest region of variability 516 for each input factor row 506A, which is between the value displayed in the low column 502B and the high column 502D for each input factor row 506 (e.g., the combined largest region of variability 516 for the air input factor row 506A is between a low value 510A of 250.88 kg/h and a high value 510B of 271.12 kg/h). The values of each of the one or more input factors can be anywhere within the corresponding combined largest region of variability 516 for the input factor and satisfy the predetermined performance metric for each output response.

The output response table 504 includes seven columns, the output response column 504A, the min column 504B, the target column 504C, the max column 504D, the criterion column 504E, the DPMO column 504F, and the predicted response profile column 504G. The output response table 504 includes a row for each output response fuel 520A, NOx 520B and soot 520C, collectively output response rows 520, which are listed in output response column 504A. The predicted response profile column 504G includes a graph 522A, 522B and 522C for each output response row 520A, 520B and 520C, respectively (collectively, graphs 522). Each graph includes a specification limit range comprising a minimum output response value 524A displayed in the minimum column 504B and a maximum output response value 524B displayed in the maximum column 504D, collectively the specification limit range 524 (e.g., the fuel output response row 520A has a specification limit range 524 between a minimum output response value 524A of 230 mg/stroke and a maximum output response value 524B of 260 mg/stroke). Each graph 522 includes a target response criterion 526, which is indicated by the corresponding entry for each output response row 520 in the target column 504C (e.g., the fuel output response row 520A has a target value of 240 mg/stroke). Each graph includes a distribution of output response values 528 for each of the one or more output response rows 520, wherein the combined largest regions of variability (e.g., the modified ranges of input values) are determinative of the distribution of output response values (e.g., as indicated for each input factor row 506A by the low column 502B and the high column 502D). For each of the one or more output responses, a prespecified number of output response values within the distribution of output response values 528 are within the specification limit range 524 for the output response (e.g., a predetermined performance metric, DPMO, is satisfied for the output response).

The criteria (e.g., the experimented range of input values 510 for each input response, the specification limit ranges 524 for each output response, and the target response criterion 526 for each output response) constrain the prediction of the PDSE. The design space estimate module 104 searches for the best input factor value that results in output response values with the smallest distance to the target response criterion 512, which are the estimated optimal values 512 for each input factor. A user can configure different settings for the calculation of the estimated optimal values 510 as shown in FIG. 5B.

FIG. 5B is a diagram illustrating a graphical display 550 for configuring parameters used to calculate an automated predictive design space estimate, according to an illustrative embodiment of the invention. The graphical display 550 includes an input factor table 552, an output response table 554, and a results table 556. Input factor table 552 displays the options a user can configure for the input factors, and includes a low limit column, a high limit column, and a sensitivity range column. Output response table 554 displays the options a user can configure for the output responses, and includes a criteria column, a weight column, a minimum value column, a target value column, and a maximum value column. Numerical values can be entered into the columns for the input factor table 552 and the output response table 554. A user can select entries from a drop-down menu in the criteria column of the output response table 554, including "Target", "Minimize", "Maximize", "Predicted", or "Excluded". "Target" indicates the output response is the desired response. "Minimize" indicates the design space estimate module 104 minimizes the output response (e.g., minimized based on a maximum accepted value criteria specified for the output response). "Maximize" indicates the design space estimate module 140 maximizes the output response (e.g., maximized based on a minimum accepted value criteria specified for the output response). "Predicted" indicates the design space estimate module 104 does not consider the output response as active in the PDSE (e.g., the design space estimation module 104 can still predict the output response). "Excluded" indicates the design space estimate module 140 excludes the output response from the PDSE (e.g., the design space estimation module 104 does not predict the output response).

The results table 556 includes nine columns, numbered one through nine. The first three columns display the calculated input factor values for each of the input factors. The second three columns display the calculated output response values for each of the output responses. The seventh column displays the number of iterations performed for the calculation, which a user can configure with the iteration box 558 and the iteration slider 560. The eighth column displays the log(D) value for the calculation. The ninth column displays the DPMO for the calculation. A user can select the absolute limits checkbox 562 which cause the design space estimate module 104 to not accept a prediction outside the criterias. A user can select the analyze sensitivity checkbox 564 which causes the design space estimate module 104 to add a Monte Carlo simulation with small disturbances on the input factor settings for the specific solution. For example, a DPMO is calculated using a Monte Carlo simulation with small disturbances. The DPMO reflects how the solution can take disturbances on the selected estimated optimal value(s) of the input factors, where the lower the DPMO the better, with the best DPMO=0. Entries in the results table 556 can be similar. In some embodiments, the ninth column displays a DPMO value for a Monte Carlo simulation with a variation of ±10% of the experimental region of input values 510 about the proposed estimated optimal value. A lower DPMO value indicates the selection of input factor value results in output responses that are less sensitive to Monte Carlo simulation errors.

The design space estimate module 104 searches for the PDSE from the estimated optimal values 512 for each input factor (e.g., via steps 204 through 210 of FIG. 2). The search for the largest regions of variability is performed stepwise based on each input factor's sensitivity towards the output response profile, which is displayed as the individual largest region of variability 514 for each input factor. The calculated combined largest region of variability 516 of the PDSE for each input factor is displayed in display 500. In some embodiments, the combined largest region of variability 516 displayed is the 95% region of a normal distribution for each input factor. A user can adjust how the combined largest region of variability 516 is displayed (e.g., changing the percentage of the region and/or the type of distribution). The calculations (e.g., monte carlo simulations) generate the predicted response profile 504G displayed for each output response.

A user can adjust the settings for calculating the PDSE. In some embodiments, the design space estimate module 104 allows a user to adjust the outer bounds for the combined largest region of variability 516 for one or more input factors. After a user adjusts the outer bounds of one or more combined largest regions of variability 516, the design space estimate module 104 recalculates the combined largest regions of variability 516 for the remaining input factors. For example, if a user limits a combined largest region of variability 516 to values within the calculated low and high values of the combined largest region of variability (e.g., by clicking on the end of a displayed combined largest region of variability 516 and sliding the mouse to the left or right), the remaining combined largest regions of variability 516 is expanded due to the constraint placed on the modified input factor. A user adjusts an input factor, for example, if the role displayed in the role column 502F is set to "Free." For example, a user limits the variability of the combined largest region of variability 516 for the air input factor to ±10 kg/h (251 kg/h-271 kg/h), which is within the low value of 250.88 kg/h and the high value 271.12 kg/h of the combined largest region of variability 516 for the air input factor row 506A. The design space estimate module 104 can expand the combined largest regions of variability 516 for the NOx and soot input factors due to the limits placed on the air input factor. The user can set the predetermined performance metric (e.g., the DPMO) for either an individual response or all responses simultaneously.

Advantageously, if a user knows a certain input factor can be constrained about certain values (e.g., temperature, pressure), the user can configure the DPMO to take into account the constraints for the input factor so that the combined largest regions of variability 516 for the remaining input factors can increase. Such a calculation allows a user to know how much the remaining input factors can vary when the constrained input factor is kept at controlled values. For example, if a user knows the temperature of a manufacturing process, the user sets the constraints for the temperature input factor to discover the tolerances for other input factors of the manufacturing process (e.g., pressure). If temperature is easy to control, the PDSE is adjusted to indicate to the user the maximum amount the harder factors to control can vary. In some embodiments, the PDSE output is used to interpret each input factor setting (e.g., a user can determine which factor is the most critical for the PDSE). If, for example, a user can't fulfill the constraints for a PDSE, the user changes the output response constraints or exclude one or more of the output responses from the PDSE model.

Figure 5C:
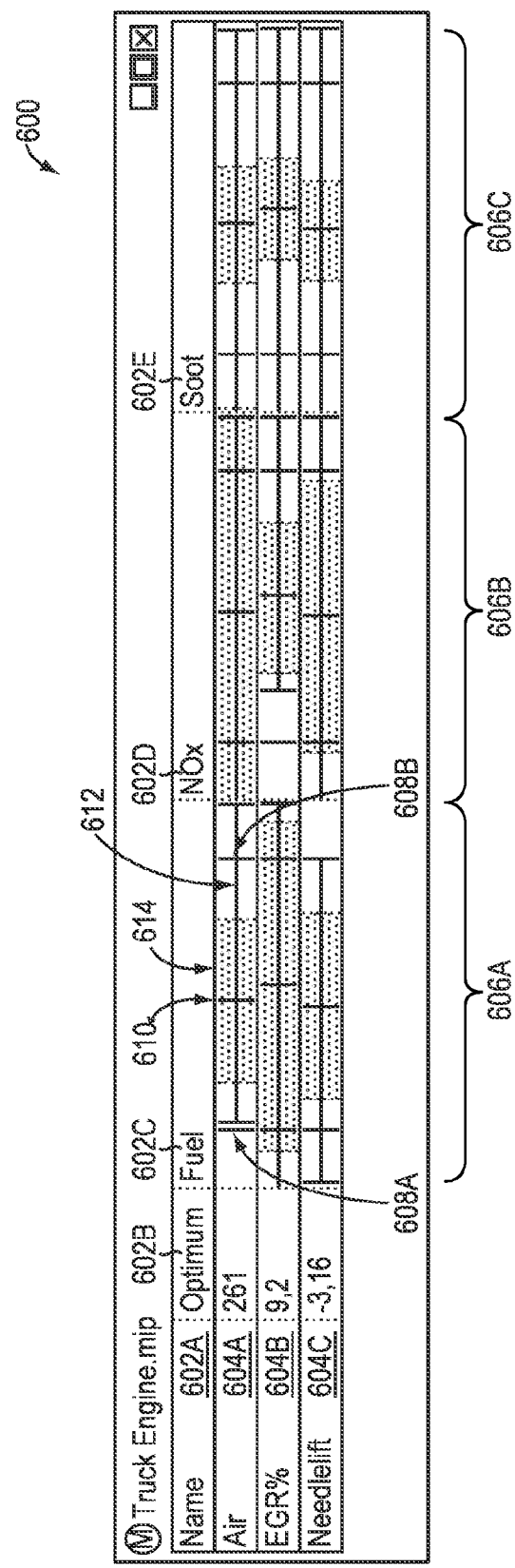
FIG. 5C is a diagram illustrating a graphical display for displaying an automated predictive design space estimate, according to an illustrative embodiment of the invention.

FIG. 5C is a diagram illustrating a graphical display 600 for displaying an automated predictive design space estimate, according to an illustrative embodiment of the invention. The graphical display 600 illustrates a sensitivity analysis between each input factor and output response. The graphical display 600 includes five columns, a name column 602A, an optimum column 602B, and a column for each of the output response values: a fuel column 602C, a NOx column 602D, and a soot column 602E. The graphical display 600 includes an entry for each input factor, air 604A, EGR % 604B, and needlelift 604C, which is displayed in the name column 602A. Each table entry in the fuel column 602C, the NOx column 602D, and the soot column 602E includes a graph 606A, 606B, and 606C, respectively, for each input factor (collectively graph 606). Each graph 606 includes an experimental region of input values, with a low value 608A a high value 608B, generally the experimented region of input values 608. Each graph 606 includes an estimated optimal value 610, which is indicated in the optimum column 602B for each input factor row 604 (e.g., the air input factor row 506A has an estimated optimal value 610 of 261 kg/h). Each graph 606 includes an individual largest region of variability 612 and a combined largest region of variability 614 for each input factor row 604.

Each graph 606 displays the results individually for each input factor and output response. Advantageously, a user can use the graphs 606 to analyze the PDSE. For example, a user discerns problematic points of the PDSE by analyzing the graphs 606. For the graphs 606, the output response (e.g., the fuel column 602C, the NOx column 602D, and the soot column 602E) that is the most difficult to fulfill for the PDSE is soot. The soot graphs 606 (for each input response 604) display the smallest combined largest regions of variability 614. Of the three graphs 606 for soot, the smallest combined largest regions of variability 614 is for EGR %. Advantageously, by analyzing the graphs 606 in this way, a user discerns the most critical factor to control for soot is EGR % because it has the smallest combined largest region of variability 614.

Figure 5D:
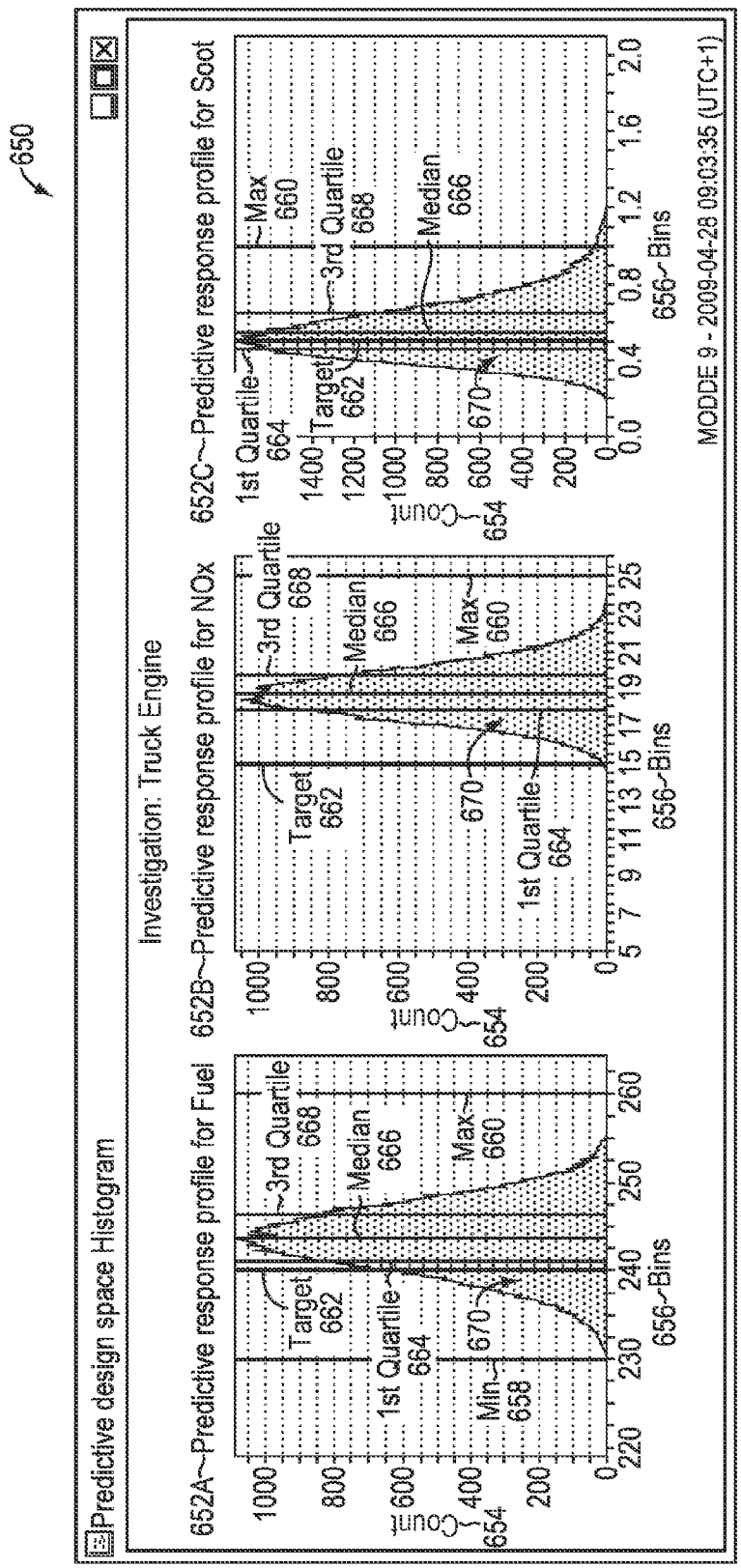
FIG. 5D is a diagram illustrating a graphical display for displaying an automated predictive design space estimate, according to an illustrative embodiment of the invention.

FIG. 5D is a diagram illustrating a graphical display 650 for displaying an automated predictive design space estimate, according to an illustrative embodiment of the invention. Graphical display 650 includes three graphs based on the PDSE for each output factor (e.g., the three graphs are alternative embodiments to display the information displayed for each output factor in the predicted response profile 504G of FIG. 5A), the predicted response profile for fuel 652A, the predicted response profile for NOx 652B, and the predicted response profile for soot 652C, collectively graphs 652. The vertical axes 654 of each graph 652 indicates the count of output response values. The horizontal axes 656 of each graph 652 indicates the number of bins for each input factor (e.g., the possible values for each input factor). Each graph includes a minimum bar 658 (if appropriate). For example, the fuel graph 652A includes a minimum bar 658 at 230 bins (e.g., mg/stroke), which corresponds to the value displayed in the entry for the fuel row 520A in the minimum column 504B in the output response table 504 of FIG. 5A. Each graph includes a maximum bar 660 (if appropriate). For example, the fuel graph 652A includes a maximum bar 660 at 260 bins, which corresponds to the value displayed in the entry for the fuel row 520A in the maximum column 504D in the output response table 504. Each graph includes a target bar 662 (if appropriate). For example, the fuel graph 652A includes a maximum bar 662 at 240 bins, which corresponds to the value displayed in the entry for the fuel row 520A in the target column 504C in the output response table 504. Each graph further includes bars to indicate the first quartile 664, the median 666, and the third quartile 668 of the calculated output response values 670 for the corresponding output response.

As another example of calculating a PDSE, a tablet manufacturing PDSE is made (e.g., in the pharmaceutical industry) for a mixture design. In this example, there are three input factors (e.g., constituents) cellulose, lactose, and phosphate. For purposes of this example, the three input factors are varied according to a modified simplex centroid mixture design (a type of constrained mixture design) to produce tablets. The output response is the release of the active substance. The criteria placed on the release output response is a minimum output response value of 300 and a target output response value of 350. The PDSE informs the user how the three input factors influence the release of the active substance.

Figure 5E:
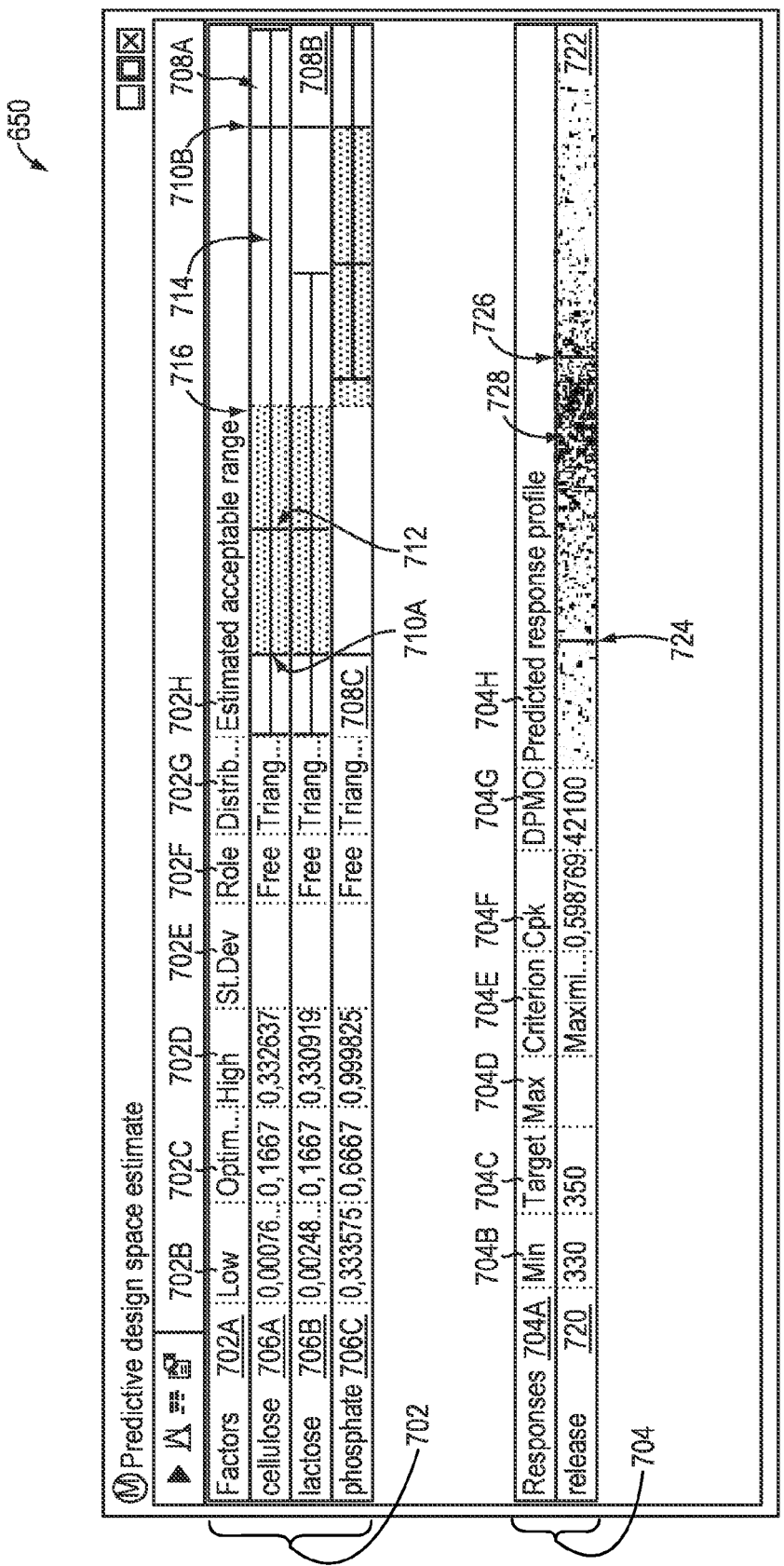
FIG. 5E is a diagram illustrating a graphical display for displaying an automated predictive design space estimate, according to an illustrative embodiment of the invention.

FIG. 5E is a diagram illustrating a graphical display 700 for displaying an automated predictive design space estimate, according to an illustrative embodiment of the invention. The graphical display 700 displays the PDSE for the tablet manufacturing example. Graphical display 700 includes an input factor table 702 and an output response table 704. The input factor table 702 includes eight columns, the input factor column 702A, the low column 702B, the optimum column 702C, the high column 702D, the standard deviation column 702E, the role column 702F, the distribution column 702G, and the estimated acceptable range column 702H. The input factor column 702A displays the input factors for the PDSE. The low column 702B displays a value for each input factor that is the lowest input factor value of the combined largest region of variability. The optimum column 702C displays a value for each input factor that is the estimated optimal value for each input factor. The high column 702D displays a value for each input factor that is the highest input factor value of the combined largest region of variability. The standard deviation column 702E lists the standard deviation for the input factors in the PDSE. The role column 702F displays the role of the input factor (locked or free). The distribution column 702G displays the distribution of the model. The input factor table 702 includes a row for each input factor cellulose 706A, lactose 706B and phosphate 706C, collectively input factor rows 706, which are listed in input factor column 702A. The estimated acceptable range column 502H includes a graph 708A, 708B and 708C for each input factor row 706A, 706B and 706C, respectively (collectively, graphs 708).

Each graph 708 in the estimated acceptable range column 702H includes an experimental region of input values, with a low value 710A a high value 710B, generally the experimented region of input values 710. Each graph 708 includes an estimated optimal value 712, which is indicated in the optimum column 702C for each input factor row 706. Each graph 708 includes an individual largest region of variability 714 for each input factor row 706A and a combined largest region of variability 716 for each input factor row 706A, which is between the value displayed in the low column 702B and the high column 702D for each input factor row 706.

The output response table 704 includes eight columns, the output response column 704A, the min column 704B, the target column 704C, the max column 704D, the criterion column 704E, the cpk column 704F, the DPMO column 704G, and the predicted response profile column 704H. The output response table 704 includes a row for the output response release 720. The predicted response profile column 704H includes a graph 722 for the output response releast 720. The graph 722 includes a specification limit range comprising a minimum output response value 724 displayed in the minimum column 704B with no maximum value since none is displayed in the maximum column 704D, which is the specification limit range. The graph 722 includes a target response criterion 726 and a distribution of output response values 728.

The target response criterion 712 is estimated with a modified simplex centroid design with 10 runs. From the target response criterion 712 for each input factor, the design space estimate module 104 calculates the PDSE and displays (e.g., via display 114) the combined largest region of variability 714 for each input factor. For this example, the design space estimate module 104 is configured to calculate the PDSE based on each input factor varying with a triangular distribution around its associated estimated optimal value 712. The combined largest regions of variability 714 are calculated with the mixture restriction. The predicted response profile 704H for the release shows the distribution of output response values 728 for input factor values within the combined largest regions of variability.

The above-described techniques can be implemented in digital and/or analog electronic circuitry, or in computer hardware, firmware, software, or in combinations of them. The implementation can be as a computer program product, i.e., a computer program tangibly embodied in a machine-readable storage device, for execution by, or to control the operation of, a data processing apparatus, e.g., a programmable processor, a computer, and/or multiple computers. A computer program can be written in any form of computer or programming language, including source code, compiled code, interpreted code and/or machine code, and the computer program can be deployed in any form, including as a stand-alone program or as a subroutine, element, or other unit suitable for use in a computing environment. A computer program can be deployed to be executed on one computer or on multiple computers at one or more sites.

Method steps can be performed by one or more processors executing a computer program to perform functions of the invention by operating on input data and/or generating output data. Method steps can also be performed by, and an apparatus can be implemented as, special purpose logic circuitry, e.g., a FPGA (field programmable gate array), a FPAA (field-programmable analog array), a CPLD (complex programmable logic device), a PSoC (Programmable System-on-Chip), ASIP (application-specific instruction-set processor), or an ASIC (application-specific integrated circuit). Subroutines can refer to portions of the computer program and/or the processor/special circuitry that implement one or more functions.

Processors suitable for the execution of a computer program include, by way of example, both general and special purpose microprocessors, and any one or more processors of any kind of digital or analog computer. Generally, a processor receives instructions and data from a read-only memory or a random access memory or both. The essential elements of a computer are a processor for executing instructions and one or more memory devices for storing instructions and/or data. Memory devices, such as a cache, can be used to temporarily store data. Memory devices can also be used for long-term data storage. Generally, a computer also includes, or is operatively coupled to receive data from or transfer data to, or both, one or more mass storage devices for storing data, e.g., magnetic, magneto-optical disks, or optical disks. A computer can also be operatively coupled to a communications network in order to receive instructions and/or data from the network and/or to transfer instructions and/or data to the network. Computer-readable storage devices suitable for embodying computer program instructions and data include all forms of volatile and non-volatile memory, including by way of example semiconductor memory devices, e.g., DRAM, SRAM, EPROM, EEPROM, and flash memory devices; magnetic disks, e.g., internal hard disks or removable disks; magneto-optical disks; and optical disks, e.g., CD, DVD, HD-DVD, and Blu-ray disks. The processor and the memory can be supplemented by and/or incorporated in special purpose logic circuitry.

To provide for interaction with a user, the above described techniques can be implemented on a computer in communication with a display device, e.g., a CRT (cathode ray tube), plasma, or LCD (liquid crystal display) monitor, for displaying information to the user and a keyboard and a pointing device, e.g., a mouse, a trackball, a touchpad, or a motion sensor, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributed computing system that includes a front-end component. The front-end component can, for example, be a client computer having a graphical user interface, a Web browser through which a user can interact with an example implementation, and/or other graphical user interfaces for a transmitting device. The above described techniques can be implemented in a distributed computing system that includes any combination of such back-end, middleware, or front-end components.

The computing system can include clients and servers. A client and a server are generally remote from each other and typically interact through a communication network. The relationship of client and server arises by virtue of computer programs running on the respective computers and having a client-server relationship to each other.

The components of the computing system can be interconnected by any form or medium of digital or analog data communication (e.g., a communication network). Examples of communication networks include circuit-based and packet-based networks. Packet-based networks can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, bluetooth, code-division multiple access (CDMA) network, time division multiple access (TDMA) network, global system for mobile communications (GSM) network), and/or other circuit-based networks.

Devices of the computing system and/or computing devices can include, for example, a computer, a computer with a browser device, a telephone, an IP phone, a mobile device (e.g., cellular phone, personal digital assistant (PDA) device, laptop computer, electronic mail device), a server, a rack with one or more processing cards, special purpose circuitry, and/or other communication devices. The browser device includes, for example, a computer (e.g., desktop computer, laptop computer) with a world wide web browser (e.g., Microsoft®) Internet Explorer available from Microsoft Corporation, Mozilla® Firefox available from Mozilla Corporation). A mobile computing device includes, for example, a Blackberry®. IP phones include, for example, a Cisco® Unified IP Phone 7985G available from Cisco System, Inc, and/or a Cisco® Unified Wireless Phone 7920 available from Cisco System, Inc.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A computerized method for estimating a design space of input factors and output responses for a physical process, comprising:
  (a) receiving, via a processor, data for one or more input factors for a physical process, one or more output responses for the process, and criteria, the criteria comprising:
    a target response criterion for each of the one or more output responses;
    an estimated optimal value for each of the one or more input factors to achieve the target response criteria; and
    an experimented range of input values for each of the one or more input factors, where each input value in the experimented range of input values is determinative of an output response value for each of the one or more output responses;
  (b) calculating, using the processor, for each of the one or more input factors, a calculated range of input values within the corresponding experimented range of input values, wherein calculating comprises:
    selecting a first range of input values for each of the one or more input factors;
    predicting values of the one or more output responses based on the first range of input values to determine a first performance metric for each of the one or more output responses; and
    creating the calculated range of input values for each of the one or more input factors by adjusting the first range of input values based on a comparison of the first performance metric and a predetermined performance metric;
  (c) calculating, using the processor, a modified range of input values for each of the one or more input factors, comprising, for each input factor of the one or more input factors:
    selecting a second range of input values by expanding the calculated range of input values by a predetermined percentage;

predicting values of the one or more output responses based on the second range of input values to determine a second performance metric for each of the one or more output responses; and creating the modified range of input values for the input factor by adjusting the second range of input values based on a comparison of the second performance metric and the predetermined performance metric; and (d) predicting, using the processor, a design space estimate based at least on the modified ranges of input values, wherein the modified ranges of input values each comprise a largest region of variability where the criteria are fulfilled for one or more of the input factors.

2. The method of claim 1, wherein the design space estimate further comprises a distribution of output response values for each of the one or more output responses, wherein the modified ranges of input values are determinative of the distribution of output response values.

3. The method of claim 2, wherein for each of the one or more output responses, a prespecified number of output response values within the distribution of output response values are within predetermined limit values for the output response if the predetermined performance metric is satisfied.

4. The method of claim 1, wherein predicting the design space estimate comprises predicting an individual largest region of variability for each input factor while any remaining input factors are set to their associated estimated optimal value.

5. The method of claim 1, wherein predicting the design space estimate comprises predicting a combined largest region of variability for each input factor, wherein values of each of the one or more input factors can be anywhere within the corresponding combined largest region of variability and satisfy the predetermined performance metric for each output response.

6. The method of claim 1, wherein creating the calculated range of input values comprises selecting a third range of input values by reducing the first range of input values by a predetermined percentage if the first performance metric is below the predetermined performance metric.

7. The method of claim 6, further comprising:
predicting values of the one or more output responses based on the third range of input values to determine a third performance metric for each of the one or more output responses; and creating the calculated range of input values for each of the one or more input factors by adjusting the third range of input values based on a comparison of the third performance metric and the predetermined performance metric.

8. The method of claim 1, wherein creating the calculated range of input values comprises the following steps if the first performance metric is above the predetermined performance metric:
setting a step size to a predetermined percentage of a size of the second range of input values;
selecting a third range of input values by expanding the first range of input values based on the step size;
predicting values of the one or more output responses based on the third range of input values to determine a third performance metric for each of the one or more output responses; and
creating the calculated range of input values for each of the one or more input factors by adjusting the third range of input values based on a comparison of the third performance metric and the predetermined performance metric.

9. The method of claim 8, wherein creating the calculated range of input values comprises the following steps if the third performance metric is below the predetermined performance metric:
selecting a fourth range of input values by expanding the third range of input values based on the step size;
predicting values of the one or more output responses based on the fourth range of input values to determine a fourth performance metric for each of the one or more output responses; and
creating the calculated range of input values for each of the one or more input factors by adjusting the fourth range of input values based on a comparison of the fourth performance metric and the predetermined performance metric.

10. The method of claim 8, wherein creating the calculated range of input values comprises the following steps if the third performance metric is above the predetermined performance metric:
setting the third range of input values equal to the first range of input values;
reducing the step size by a predetermined percentage;
selecting a fourth range of input values by expanding the third range of input values based on the step size;
predicting values of the one or more output responses based on the fourth range of input values to determine a fourth performance metric for each of the one or more output responses; and
creating the calculated range of input values for each of the one or more input factors by adjusting the fourth range of input values based on a comparison of the fourth performance metric and the predetermined performance metric.

11. The method of claim 1, wherein creating the modified range of input values comprises the following steps if the second performance metric is above the predetermined performance metric:
setting the modified range of input values equal to the second range of input values; and
associating a completion flag with the input factor.

12. The method of claim 1, wherein creating the modified range of input values comprises the following steps if the second performance metric is below the predetermined performance metric:
selecting a third range of input values by expanding the second range of input values by a step size, wherein the step size was used to select the second range of input values;
predicting values of the one or more output responses based on the third range of input values to determine a third performance metric for each of the one or more output responses; and
creating the modified range of input values for the input factor by adjusting the third range of input values based on a comparison of the third performance metric and the predetermined performance metric.

13. The method of claim 1, wherein calculating the modified range of input values for each of the one or more input factors further comprises the following steps:
determining each of the one or more input factors are associated with a completion flag;
reducing a step size used to select the second range of input values by a predetermined percentage; and for each of the one or more input factors of the one or more input factors:
selecting a third range of input values by expanding the second range of input values by the step size;
predicting values of the one or more output responses based on the third range of input values to determine a third performance metric for each of the one or more output responses; and
creating the modified range of input values for the input factor by adjusting the third range of input values based on a comparison of the third performance metric and the predetermined performance metric.

14. The method of claim 1, wherein:
predicting the values of the one or more output responses comprises performing a Monte Carlo simulation; and
the first performance metric, the second performance metric, and the predetermined performance metric are a measure of the number of values of the one or more output responses within predetermined limit values.

15. The method of claim 1, wherein selecting the first range of input values for each of the one or more input factors comprises setting the first range of input values to a predetermined percentage of a lower outer bound value of the corresponding input factor.

16. The method of claim 1, further comprising the following steps:
receiving a constraint for the one or more input factors; and
predicting values of the one or more output responses based on the first range of input values further comprises adjusting the prediction to compensate for the constraint.

17. The method of claim 16 wherein the constraint comprises a user defined limit on one or more input factors, a factor distribution, or any combination thereof.

18. The method of claim 1, wherein the target response criterion for each of the one or more output responses comprises a target response value, a range of acceptable target response values, or a critical target response value, where the output response can either be above or below the critical target response value.

19. The method of claim 1, wherein the physical process comprises a manufacturing process, an industrial process, a design project, a semiconductor project, or any combination thereof.

20. An apparatus for estimating a design space of input factors and output responses for a physical process, comprising a processor configured to:
(a) receive data for one or more input factors for a physical process, one or more output responses for the process, and criteria, the criteria comprising:
a target response criterion for each of the one or more output responses;
an estimated optimal value for each of the one or more input factors to achieve the target response criteria; and
an experimented range of input values for each of the one or more input factors, where each input value in the experimented range of input values is determinative of an output response value for each of the one or more output responses;
(b) calculate, for each of the one or more input factors, a calculated range of input values within the corresponding experimented range of input values, wherein calculating comprises:
selecting a first range of input values for each of the one or more input factors;
predicting values of the one or more output responses based on the first range of input values to determine a first performance metric for each of the one or more output responses; and
creating the calculated range of input values for each of the one or more input factors by adjusting the first range of input values based on a comparison of the first performance metric and a predetermined performance metric;
(c) calculate a modified range of input values for each of the one or more input factors, comprising, for each input factor of the one or more input factors:
selecting a second range of input values by expanding the calculated range of input values by a predetermined percentage;
predicting values of the one or more output responses based on the second range of input values to determine a second performance metric for each of the one or more output responses; and
creating the modified range of input values for the input factor by adjusting the second range of input values based on a comparison of the second performance metric and the predetermined performance metric; and
(d) predict a design space estimate based at least on the modified ranges of input values, wherein the modified ranges of input values each comprise a largest region of variability where the criteria are fulfilled for one or more of the input factors.

21. A computer program product, tangibly embodied in a computer-readable storage device, the computer program product including instructions being operable to cause a data processing apparatus to:
(a) receive data for one or more input factors for a physical process, one or more output responses for the process, and criteria, the criteria comprising:
a target response criterion for each of the one or more output responses;
an estimated optimal value for each of the one or more input factors to achieve the target response criteria; and
an experimented range of input values for each of the one or more input factors, where each input value in the experimented range of input values is determinative of an output response value for each of the one or more output responses;
(b) calculate, for each of the one or more input factors, a calculated range of input values within the corresponding experimented range of input values, wherein calculating comprises:
selecting a first range of input values for each of the one or more input factors;
predicting values of the one or more output responses based on the first range of input values to determine a first performance metric for each of the one or more output responses; and
creating the calculated range of input values for each of the one or more input factors by adjusting the first range of input values based on a comparison of the first performance metric and a predetermined performance metric;
(c) calculate a modified range of input values for each of the one or more input factors, comprising, for each input factor of the one or more input factors:
selecting a second range of input values by expanding the calculated range of input values by a predetermined percentage;

predicting values of the one or more output responses based on the second range of input values to determine a second performance metric for each of the one or more output responses; and creating the modified range of input values for the input factor by adjusting the second range of input values based on a comparison of the second performance metric and the predetermined performance metric; and (d) predict a design space estimate based at least on the modified ranges of input values, wherein the modified ranges of input values each comprise a largest region of variability where the criteria are fulfilled for one or more of the input factors.

22. A system for estimating a design space of input factors and output responses for a physical process, the system comprising:

(a) means for receiving data for one or more input factors for a physical process, one or more output responses for the process, and criteria, the criteria comprising:

a target response criterion for each of the one or more output responses;

an estimated optimal value for each of the one or more input factors to achieve the target response criteria; and an experimented range of input values for each of the one or more input factors, where each input value in the experimented range of input values is determinative of an output response value for each of the one or more output responses;

(b) means for calculating, for each of the one or more input factors, a calculated range of input values within the corresponding experimented range of input values, wherein calculating comprises:

selecting a first range of input values for each of the one or more input factors;

predicting values of the one or more output responses based on the first range of input values to determine a first performance metric for each of the one or more output responses; and creating the calculated range of input values for each of the one or more input factors by adjusting the first range of input values based on a comparison of the first performance metric and a predetermined performance metric;

(c) means for calculating a modified range of input values for each of the one or more input factors, comprising, for each input factor of the one or more input factors:

selecting a second range of input values by expanding the calculated range of input values by a predetermined percentage;

predicting values of the one or more output responses based on the second range of input values to determine a second performance metric for each of the one or more output responses; and creating the modified range of input values for the input factor by adjusting the second range of input values based on a comparison of the second performance metric and the predetermined performance metric; and (d) means for predicting a design space estimate based at least on the modified ranges of input values, wherein the modified ranges of input values each comprise a largest region of variability where the criteria are fulfilled for one or more of the input factors.

* * * * *